US012610856B2

(12) United States Patent
Homma et al.

(10) Patent No.: US 12,610,856 B2
(45) Date of Patent: Apr. 21, 2026

(54) SEMICONDUCTOR DEVICE AND METHOD FOR MANUFACTURING SEMICONDUCTOR DEVICE

(71) Applicant: Kioxia Corporation, Tokyo (JP)

(72) Inventors: Soichi Homma, Mie (JP); Kazuma Hasegawa, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 221 days.

(21) Appl. No.: 17/681,487

(22) Filed: Feb. 25, 2022

(65) Prior Publication Data

US 2023/0089223 A1 Mar. 23, 2023

(30) Foreign Application Priority Data

Sep. 22, 2021 (JP) ................................. 2021-154454

(51) Int. Cl.
*H01L 25/065* (2023.01)
*H01L 25/00* (2006.01)

(52) U.S. Cl.
CPC .......... *H01L 25/0657* (2013.01); *H01L 25/50* (2013.01); *H01L 2225/0651* (2013.01); *H01L 2225/06517* (2013.01); *H01L 2225/06562* (2013.01); *H01L 2225/06586* (2013.01)

(58) Field of Classification Search
CPC ................. H01L 25/0657; H01L 25/50; H01L 2225/0651; H01L 2225/06517; H01L 2225/06562; H01L 2225/06586; H10B 80/00
See application file for complete search history.

(56) References Cited

U.S. PATENT DOCUMENTS

| | | | |
|---|---|---|---|
| 6,476,503 B1 | 11/2002 | Imamura et al. | |
| 7,667,333 B2 | 2/2010 | Singleton et al. | |
| 7,911,064 B2 | 3/2011 | Komatsu et al. | |
| 7,951,702 B2 | 5/2011 | Wood et al. | |
| 10,276,545 B1 | 4/2019 | Huang et al. | |
| 2003/0153122 A1* | 8/2003 | Brooks | H01L 24/06 257/784 |
| 2009/0230546 A1 | 9/2009 | Komatsu et al. | |
| 2012/0193782 A1 | 8/2012 | Akamatsu | |
| 2013/0234308 A1 | 9/2013 | Yamada et al. | |
| 2014/0175671 A1 | 6/2014 | Haba et al. | |
| 2018/0211936 A1* | 7/2018 | Chang | H01L 24/96 |
| 2019/0043733 A1 | 2/2019 | Kapusta et al. | |
| 2019/0067248 A1 | 2/2019 | Yoo et al. | |

(Continued)

FOREIGN PATENT DOCUMENTS

| | | |
|---|---|---|
| CN | 104995732 A | 10/2015 |
| CN | 109643702 A | 4/2019 |

(Continued)

*Primary Examiner* — Timor Karimy
(74) *Attorney, Agent, or Firm* — Foley & Lardner LLP

(57) ABSTRACT

A semiconductor device includes: an interconnect substrate including a plurality of interconnect layers; a first semiconductor chip disposed over the interconnect substrate; a second semiconductor chip disposed over the first semiconductor chip in a shifted manner and including a plurality of metal bumps on a surface of the second semiconductor chip facing the interconnect substrate; and a plurality of columnar electrodes connecting the interconnect structure to the metal bumps.

6 Claims, 27 Drawing Sheets

(56)     References Cited

U.S. PATENT DOCUMENTS

| | | | |
|---|---|---|---|
| 2019/0229093 A1 | 7/2019 | Dominguez et al. | |
| 2020/0020638 A1* | 1/2020 | Heo | H01L 23/5383 |
| 2021/0272932 A1* | 9/2021 | Yoo | H01L 21/6835 |
| 2022/0254755 A1 | 8/2022 | Zeng et al. | |

FOREIGN PATENT DOCUMENTS

| | | | |
|---|---|---|---|
| CN | 112956023 A | | 6/2021 |
| JP | 2001-118876 A | | 4/2001 |
| JP | 2002-033443 A | | 1/2002 |
| JP | 2010-161430 A | | 7/2010 |
| JP | 2010-192928 A | | 9/2010 |
| JP | 2013-214540 A | | 10/2013 |
| JP | 2020-529734 A | | 10/2020 |
| TW | 201025532 | * | 7/2010 |
| TW | 201025532 A | | 7/2010 |
| TW | 201238030 A | | 9/2012 |
| TW | 201701416 A | | 1/2017 |
| TW | 201921625 A | | 6/2019 |
| TW | 201943039 A | | 11/2019 |
| WO | WO-2006/095602 | | 9/2006 |

* cited by examiner

21

211

21

22

27

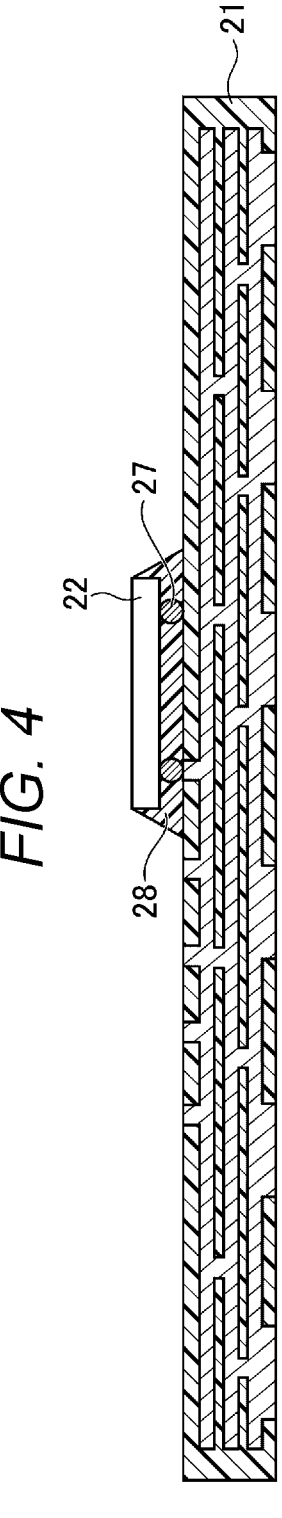
*FIG. 4*
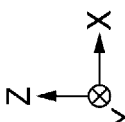

*FIG. 5*
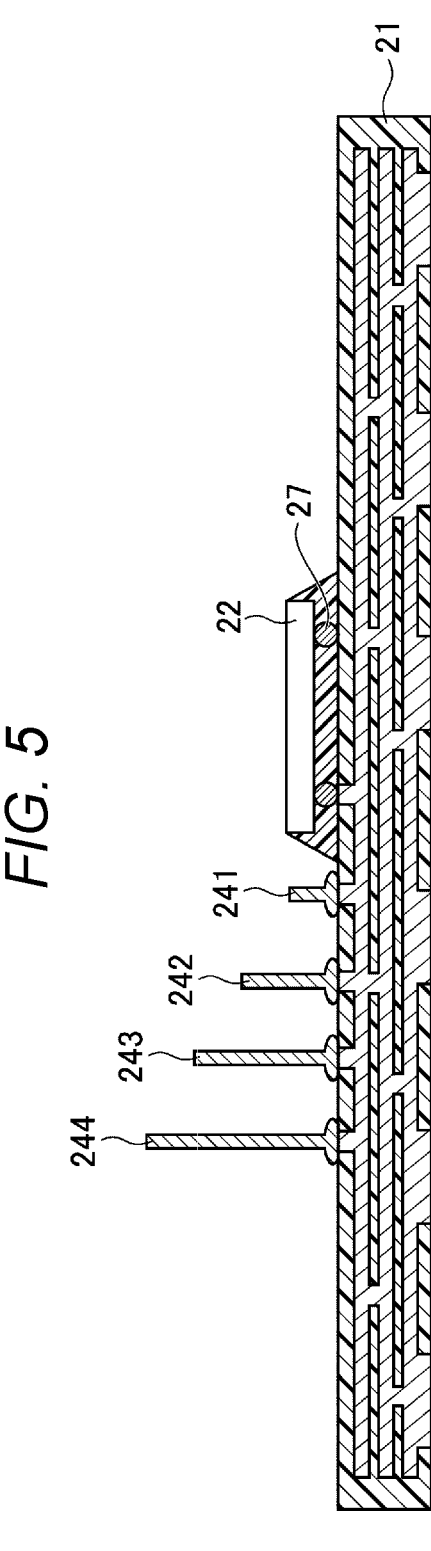
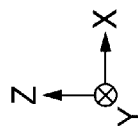

*FIG. 9*
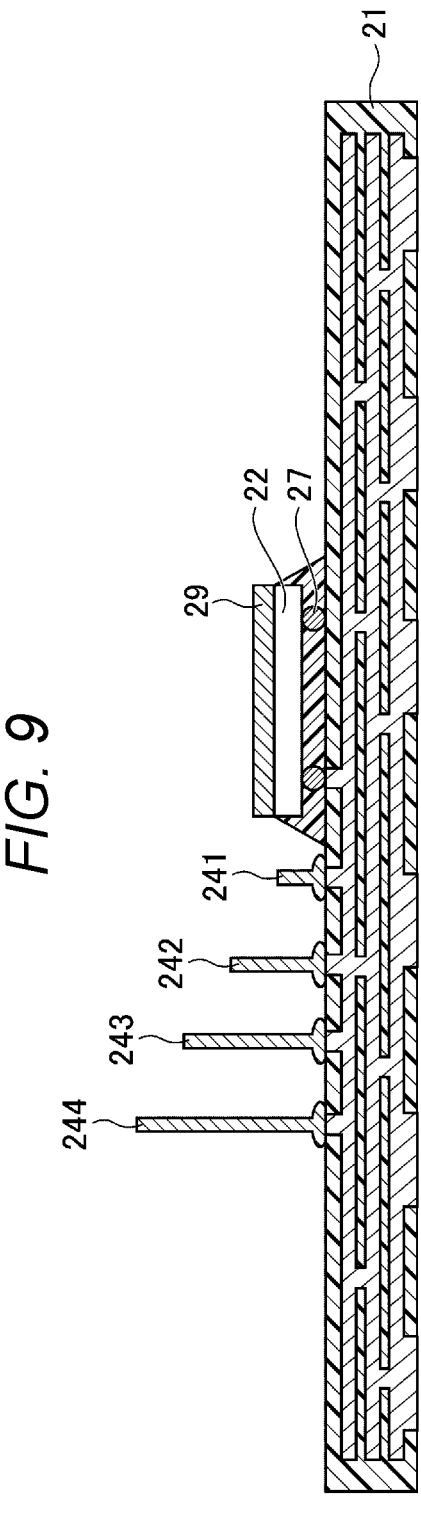
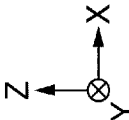

*FIG. 10*
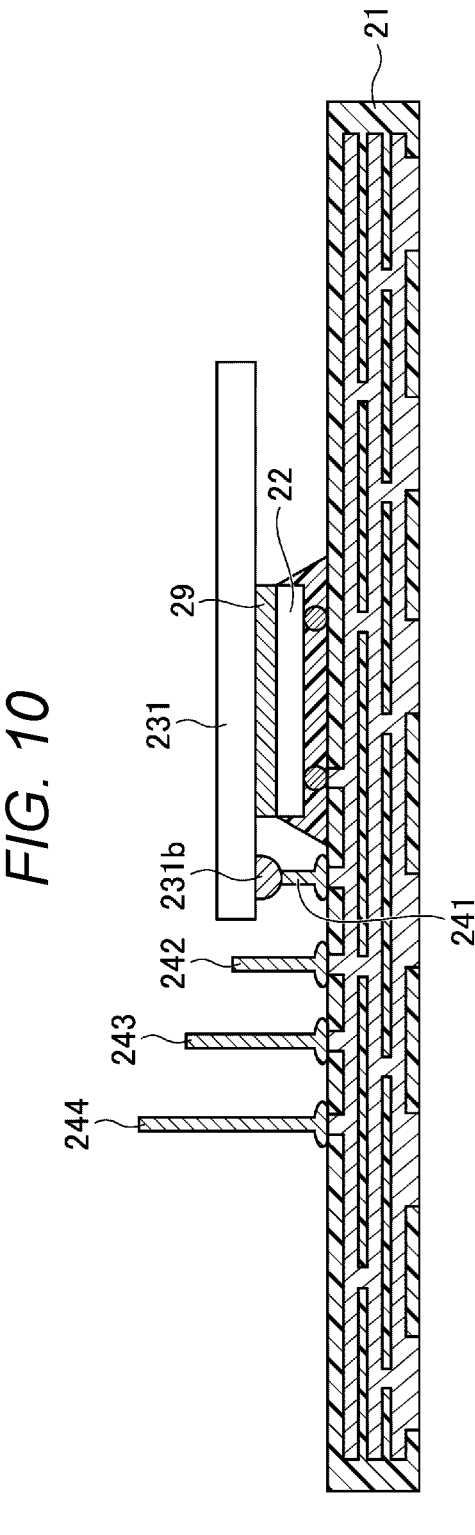
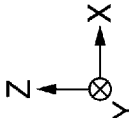

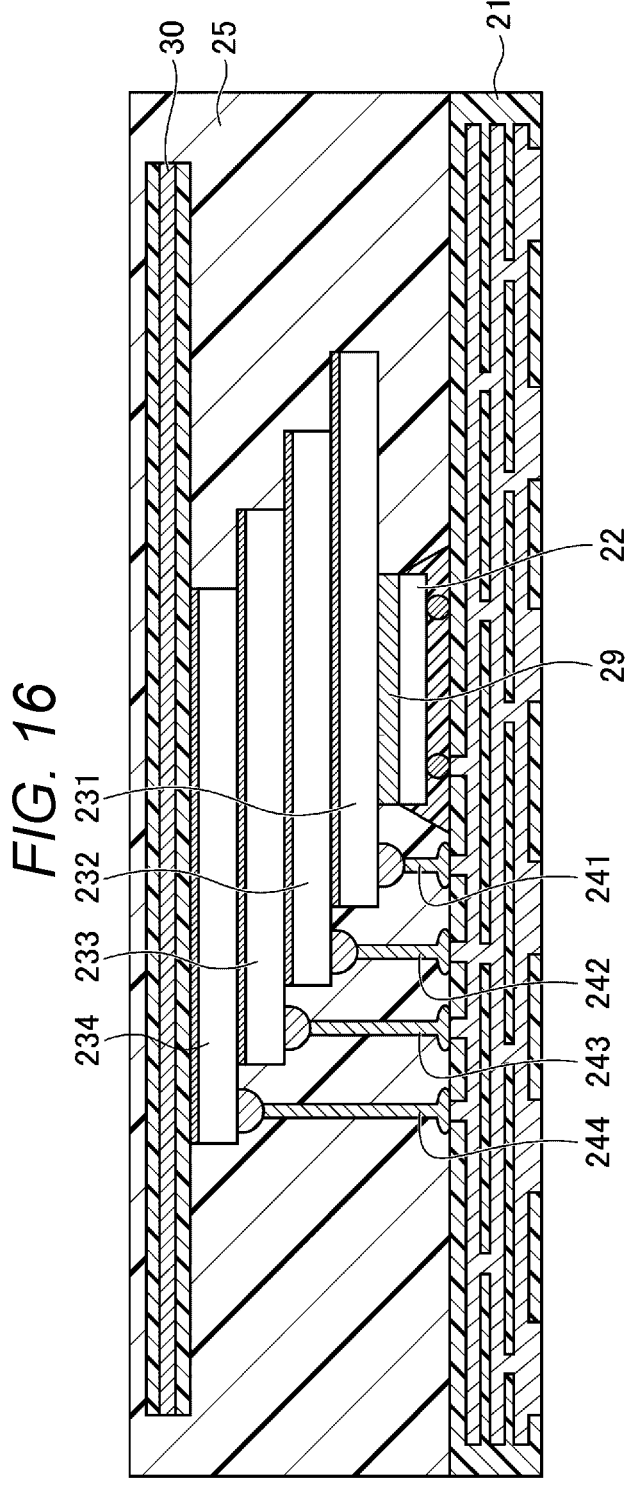
*FIG. 16*
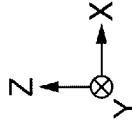

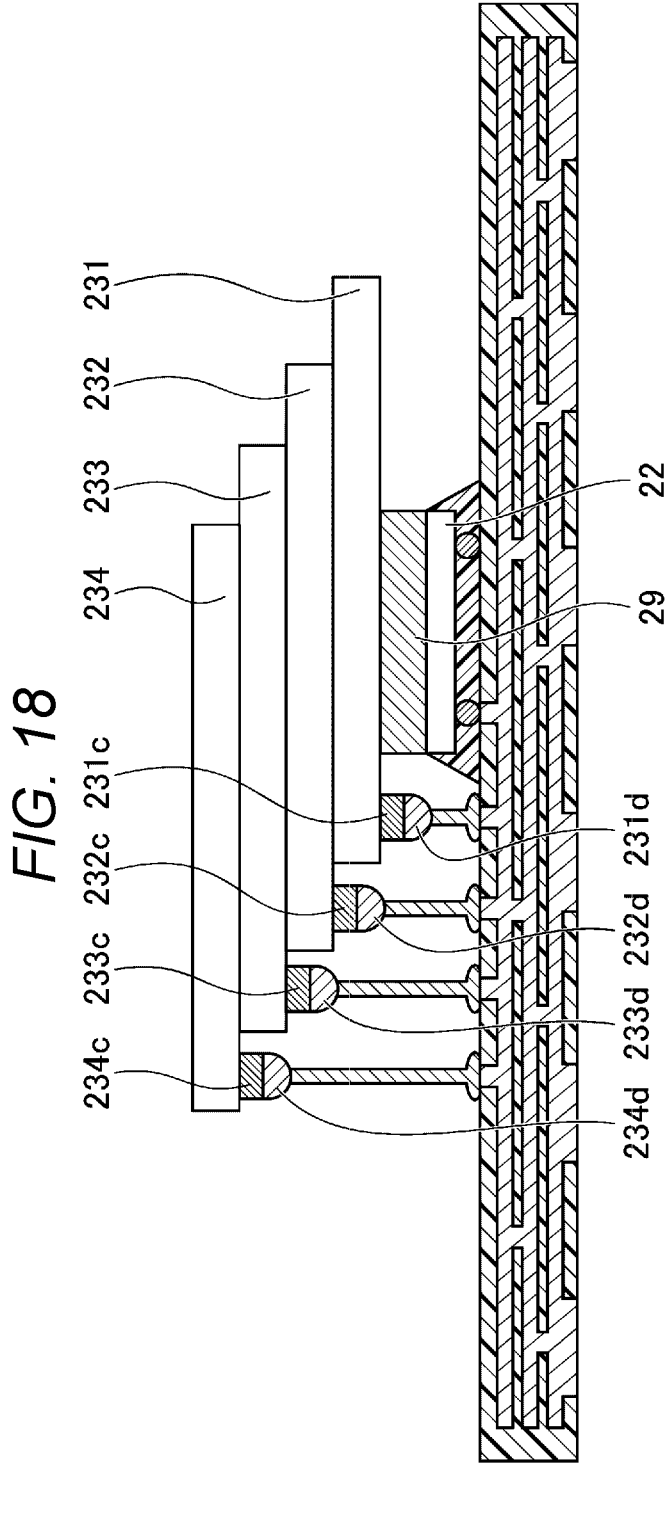
*FIG. 18*
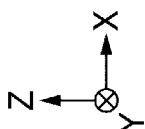

*FIG. 19*
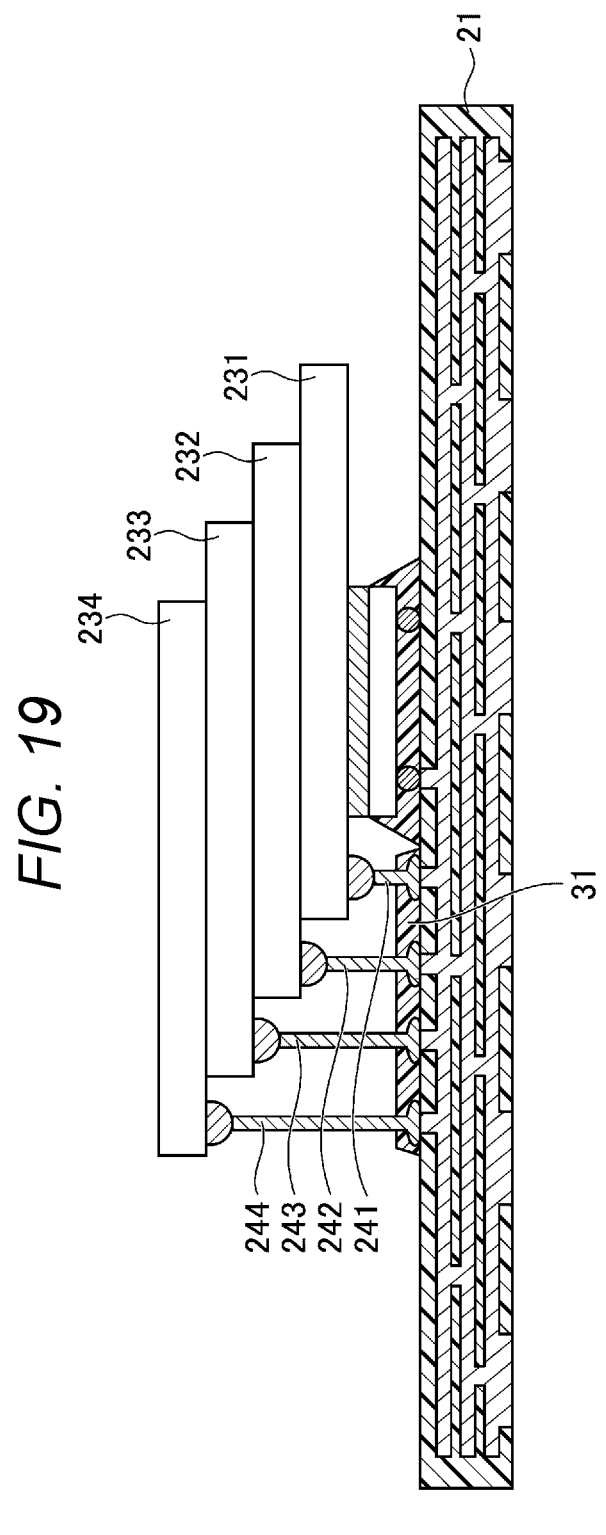
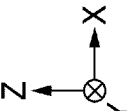

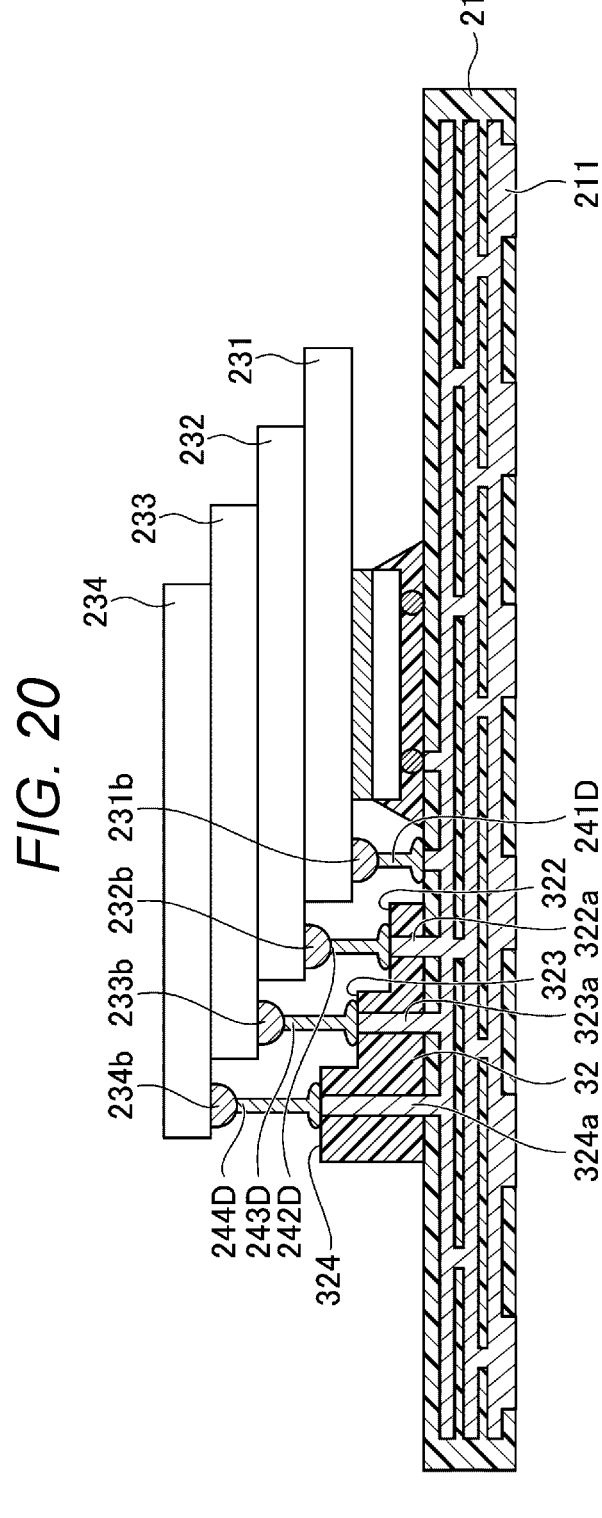
*FIG. 20*
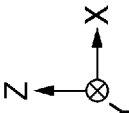

FIG. 21
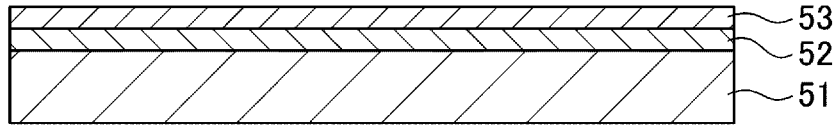
53
52
51
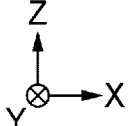
Z
Y⊗ →X
FIG. 22
244
243
242
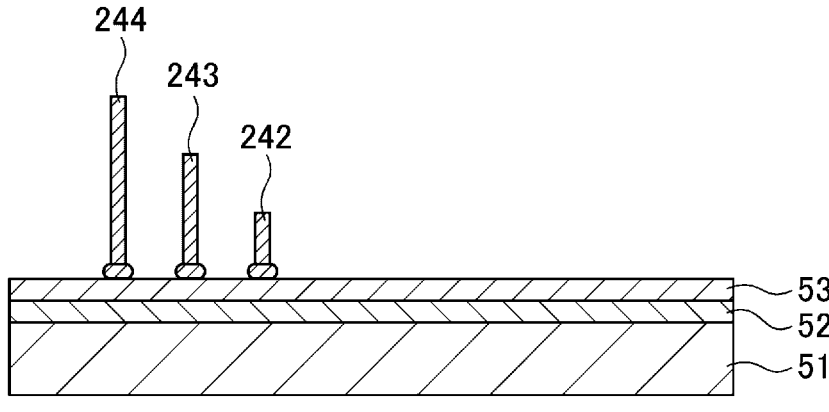
53
52
51
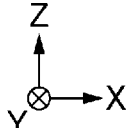
Z
Y⊗ →X

*FIG. 23*
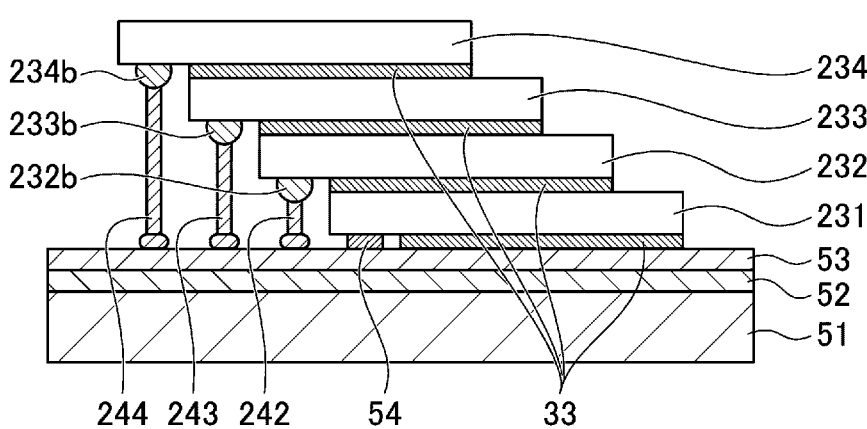
234b
233b
232b
244 243 242 54 33
234
233
232
231
53
52
51
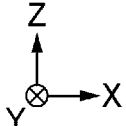
*FIG. 24*
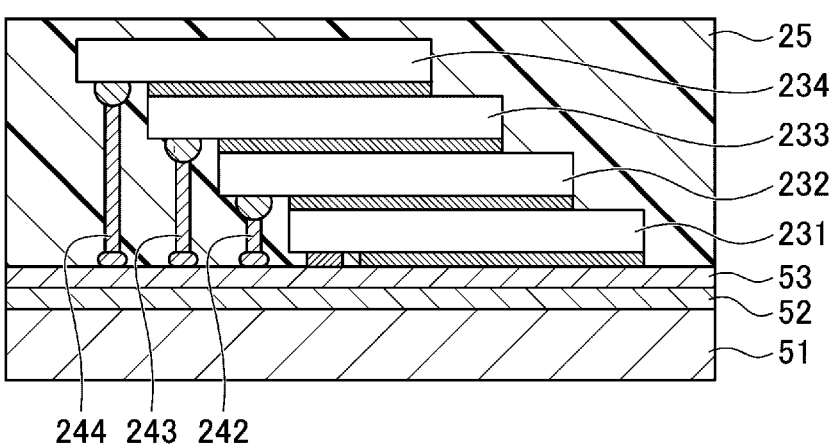
244 243 242
25
234
233
232
231
53
52
51
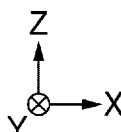

FIG. 25
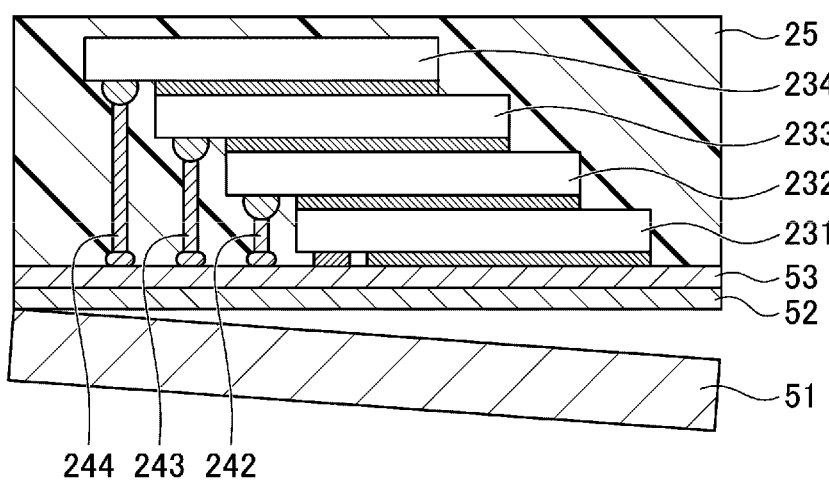
25
234
233
232
231
53
52
51
244 243 242
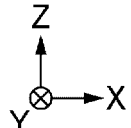
FIG. 26
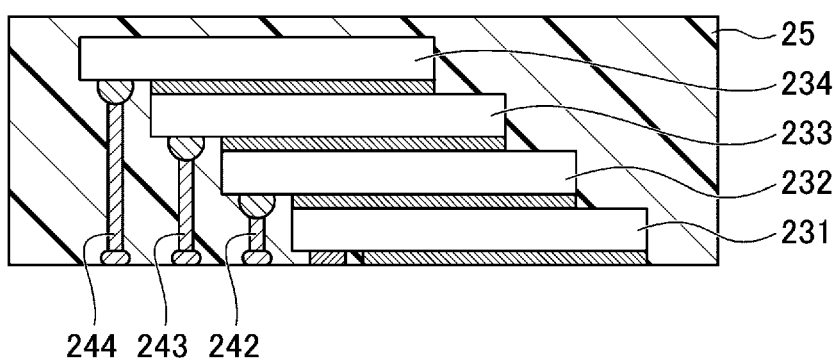
25
234
233
232
231
244 243 242
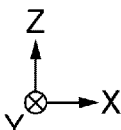

FIG. 27
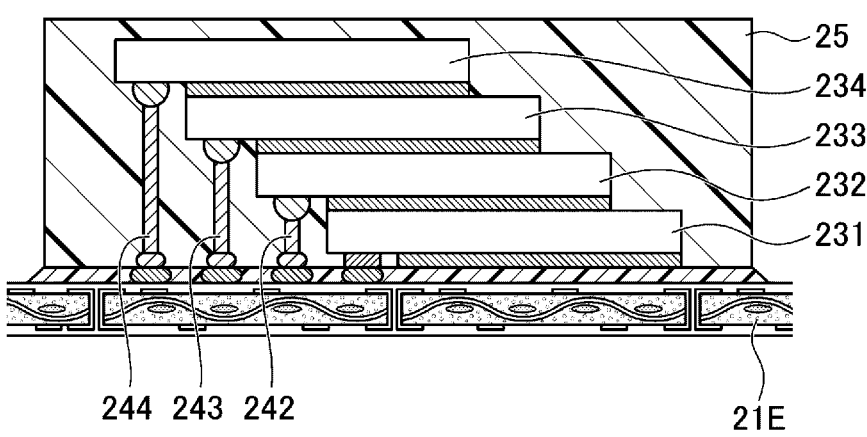
25
234
233
232
231
244  243  242                                    21E
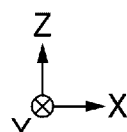

FIG. 28
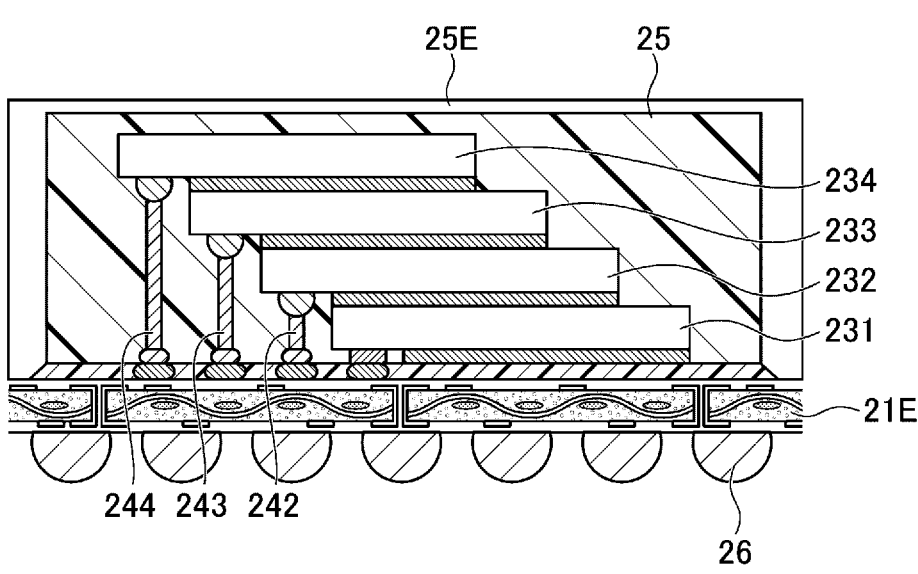
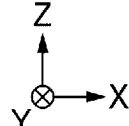
Z
X
Y

*FIG. 29*
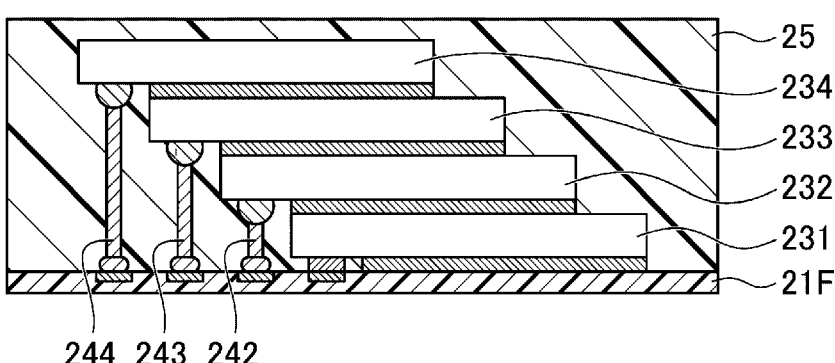
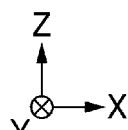

*FIG. 30*
2F
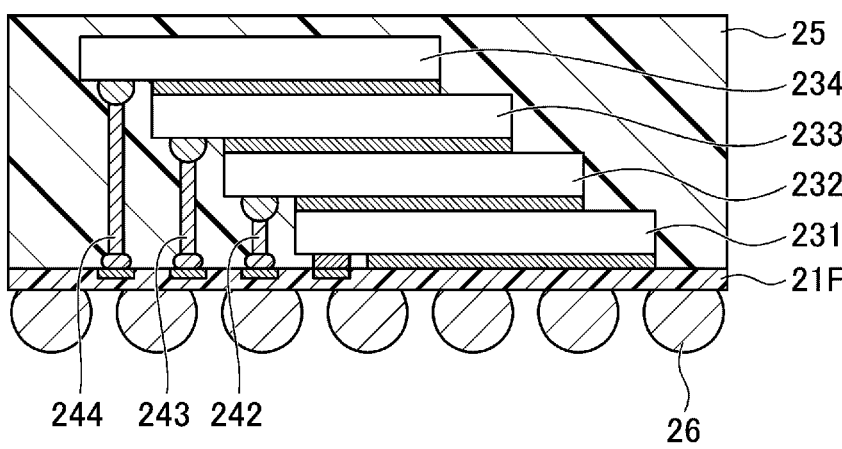
244 243 242 26
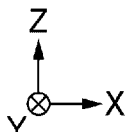
*FIG. 31*
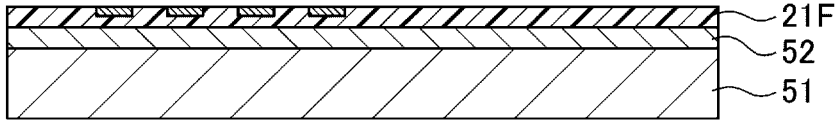
21F
52
51
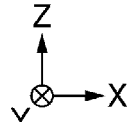

FIG. 32
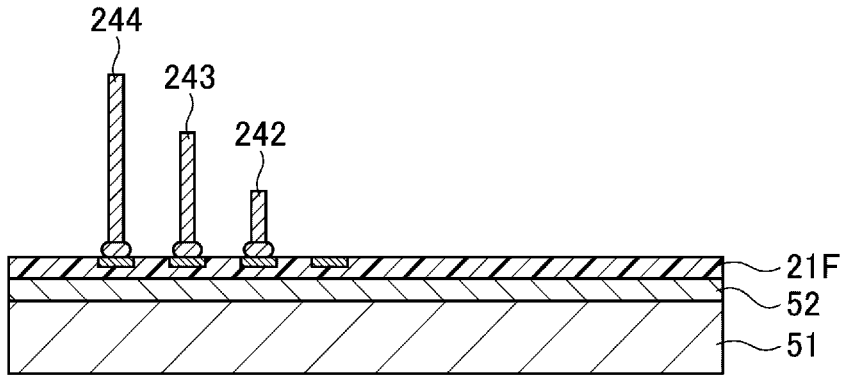
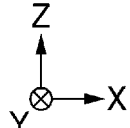
FIG. 33
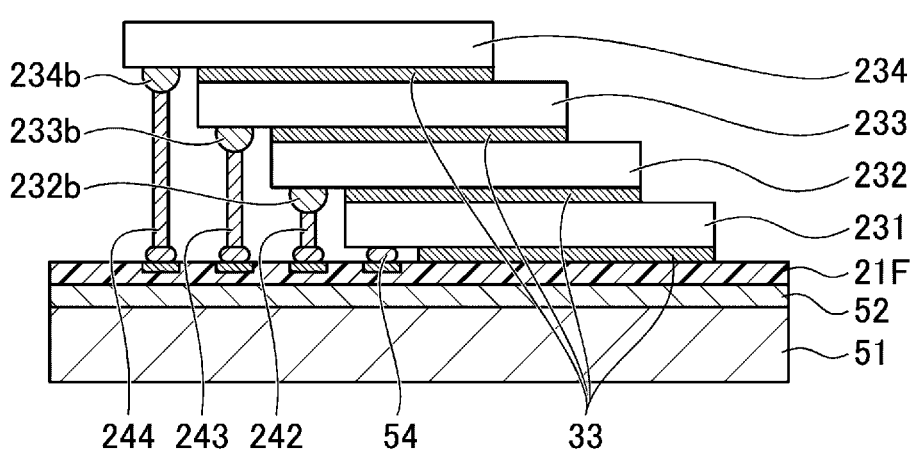
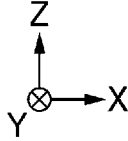

FIG. 34
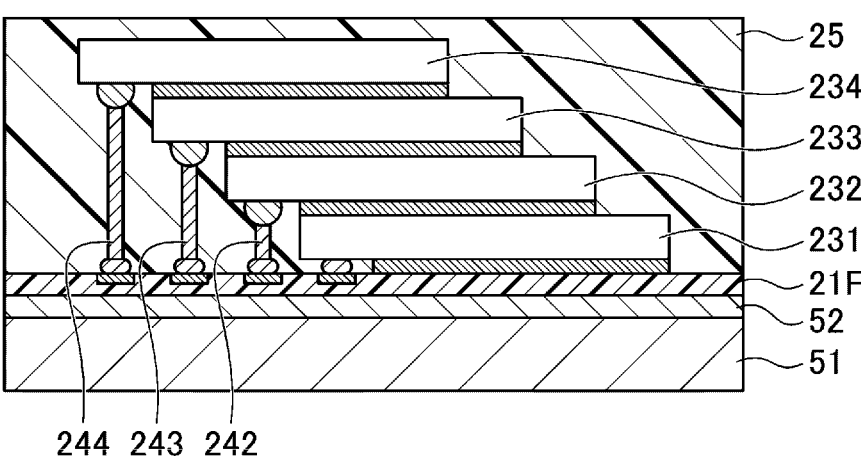
25
234
233
232
231
21F
52
51
244 243 242
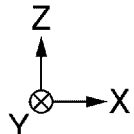
FIG. 35
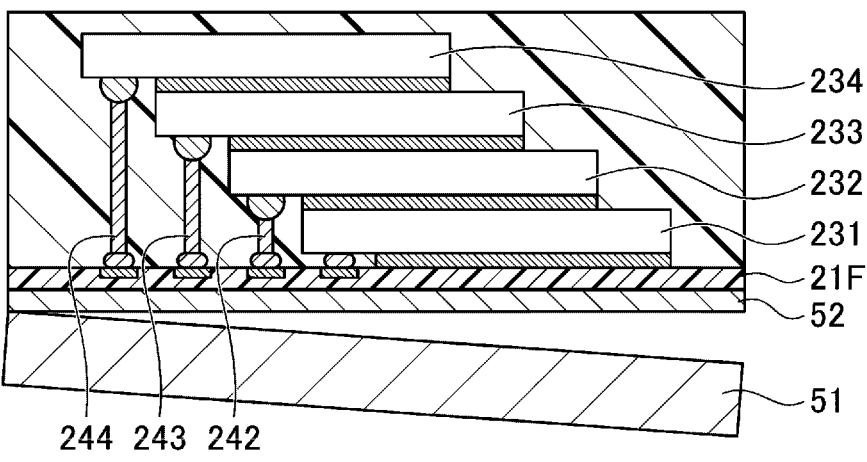
234
233
232
231
21F
52
51
244 243 242
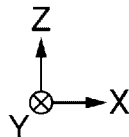

SEMICONDUCTOR DEVICE AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2021-154454, filed Sep. 22, 2021, the entire contents of which are incorporated herein by reference.

FIELD

Embodiments described herein relate generally to a semiconductor device and a method for manufacturing the semiconductor device.

BACKGROUND

A semiconductor device may include a number of stacked semiconductor chips.

DESCRIPTION OF THE DRAWINGS

FIG. 4 is a diagram illustrating the method for manufacturing the semiconductor device according to the first embodiment.

FIG. 5 is a diagram illustrating the method for manufacturing the semiconductor device according to the first embodiment.

FIG. 9 is a diagram illustrating the method for manufacturing the semiconductor device according to the first embodiment.

FIG. 10 is a diagram illustrating the method for manufacturing the semiconductor device according to the first embodiment.

FIG. 16 is a diagram illustrating the variation of the method for manufacturing the semiconductor device according to the first embodiment.

FIG. 18 is a diagram illustrating a variation of the semiconductor device according to the first embodiment.

FIG. 19 is a diagram illustrating a variation of the semiconductor device according to the first embodiment.

FIG. 20 is a diagram illustrating a variation of the semiconductor device according to the first embodiment.

FIG. 21 is a diagram illustrating a method for manufacturing a semiconductor device according to a second embodiment.

FIG. 22 is a diagram illustrating the method for manufacturing the semiconductor device according to the second embodiment.

FIG. 23 is a diagram illustrating the method for manufacturing the semiconductor device according to the second embodiment.

FIG. 24 is a diagram illustrating the method for manufacturing the semiconductor device according to the second embodiment.

FIG. 25 is a diagram illustrating the method for manufacturing the semiconductor device according to the second embodiment.

FIG. 26 is a diagram illustrating the method for manufacturing the semiconductor device according to the second embodiment.

FIG. 27 is a diagram illustrating the method for manufacturing the semiconductor device according to the second embodiment.

FIG. 28 is a diagram illustrating the method for manufacturing the semiconductor device according to the second embodiment.

FIG. 29 is a diagram illustrating a method for manufacturing a variation of the semiconductor device according to the second embodiment.

FIG. 30 is a diagram illustrating the method for manufacturing the variation of the semiconductor device according to the second embodiment.

FIG. 31 is a diagram illustrating a method for manufacturing the variation of the semiconductor device according to the second embodiment.

FIG. 32 is a diagram illustrating the method for manufacturing the variation of the semiconductor device according to the second embodiment.

FIG. 33 is a diagram illustrating the method for manufacturing the variation of the semiconductor device according to the second embodiment.

FIG. 34 is a diagram illustrating the method for manufacturing the variation of the semiconductor device according to the second embodiment.

FIG. 35 is a diagram illustrating the method for manufacturing the variation of the semiconductor device according to the second embodiment.

DETAILED DESCRIPTION

The present disclosure is directed to preventing cracking in semiconductor chips, provided on an interconnect substrate, when connecting the interconnect substrate and the semiconductor chips with columnar electrodes.

In general, according to one embodiment, a semiconductor device includes: an interconnect substrate including a plurality of interconnect layers; a first semiconductor chip disposed over the interconnect substrate; a second semiconductor chip disposed over the first semiconductor chip in a shifted manner and including a plurality of metal bumps on a surface of the second semiconductor chip facing the interconnect substrate; and a plurality of columnar electrodes connecting the interconnect structure to the metal bumps.

According to another embodiment, a method for manufacturing a semiconductor device includes: preparing an interconnect substrate internally having interconnect layers; mounting a first semiconductor chip on the interconnect substrate; forming columnar electrodes on the interconnect substrate; and mounting a second semiconductor chip on the first semiconductor chip in a shifted manner, and bonding the columnar electrodes to metal bumps provided on the second semiconductor chip.

Embodiments of the present disclosure will now be described with reference to the attached drawings. For easier understanding of the drawings and the description below, same symbols are used for the same or similar components or elements as much as possible, and a duplicate description thereof is omitted.

Figure 1:
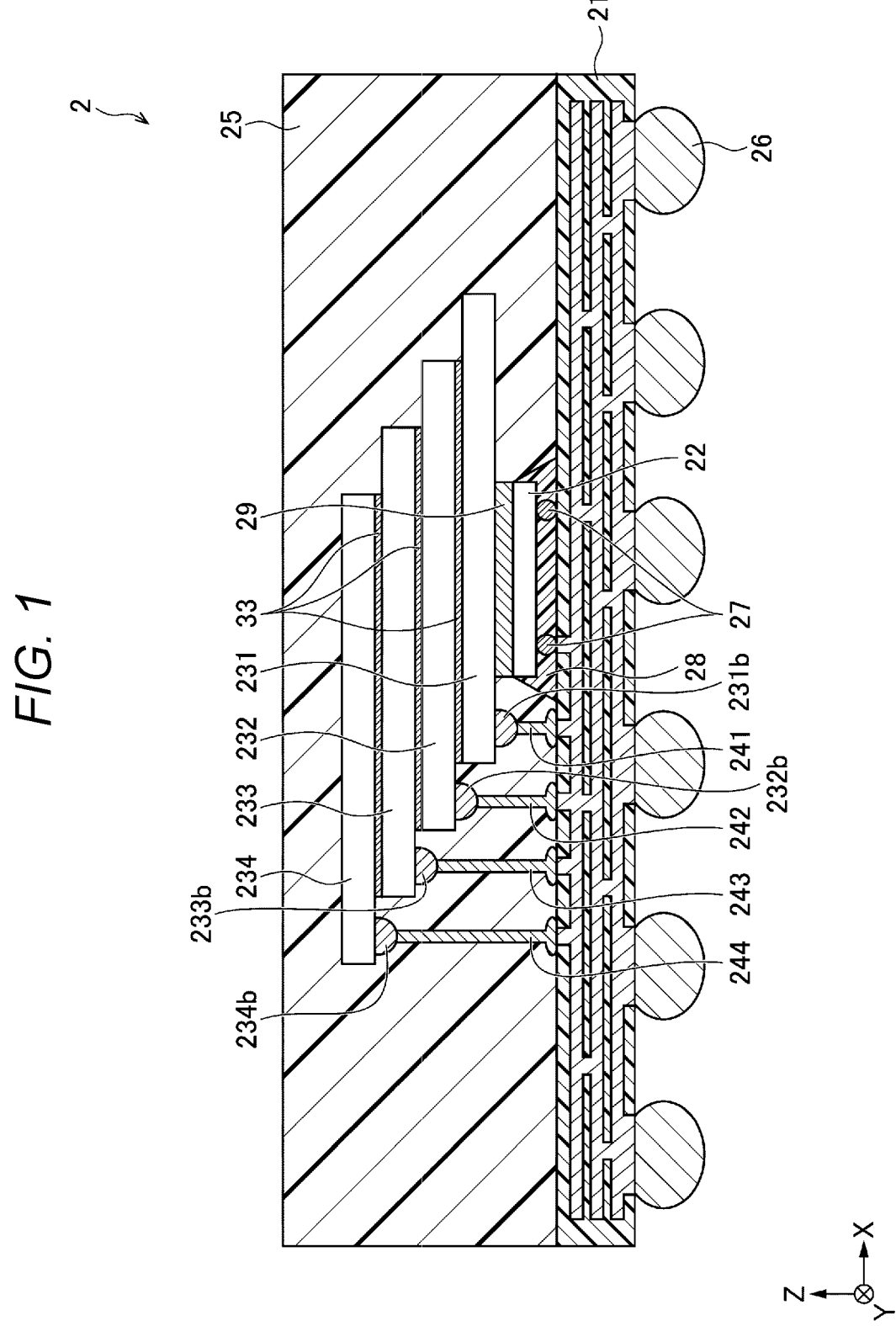
FIG. 1 is a cross-sectional view of a semiconductor device according to a first embodiment.

A semiconductor device 2 according to a first embodiment will be described with reference to FIG. 1. FIG. 1 is a cross-sectional view of the semiconductor device 2. As shown in FIG. 1, the semiconductor device 2 includes an interconnect substrate 21, a first semiconductor chip 22, second semiconductor chips 231, 232, 233, 234, columnar electrodes 241, 242, 243, 244, a molded resin layer 25, and metal balls 26.

The first semiconductor chip 22 has been flip-chip mounted on the interconnect substrate 21. The first semiconductor chip 22 may be, for example, a NAND flash memory chip or a semiconductor chip with any LSI. The first semiconductor chip 22 is mounted on the interconnect substrate 21 via first metal bumps 27.

A first resin layer 28 is provided between the first semiconductor chip 22 and the interconnect substrate 21. The first resin layer 28 is an underfill (UF) material. The second semiconductor chip 231 is mounted on the first semiconductor chip 22. A second resin layer 29 is provided between the first semiconductor chip 22 and the second semiconductor chip 231.

The second semiconductor chip 232 is mounted on the second semiconductor chip 231 in a shifted manner. A third resin layer 33 is provided between the second semiconductor chip 231 and the second semiconductor chip 232. The third resin layer 33 is a die attach film (DAF).

The second semiconductor chip 233 is mounted on the second semiconductor chip 232 in a shifted manner. A third resin layer 33 is provided between the second semiconductor chip 232 and the second semiconductor chip 233. The second semiconductor chip 234 is mounted on the second semiconductor chip 233 in a shifted manner. A third resin layer 33 is provided between the second semiconductor chip 233 and the second semiconductor chip 234.

Second metal bumps 231b are provided on the interconnect substrate 21-facing surface of the second semiconductor chip 231. Second metal bumps 232b are provided on the interconnect substrate 21-facing surface of the second semiconductor chip 232. Second metal bumps 233b are provided on the interconnect substrate 21-facing surface of the second semiconductor chip 233. Second metal bumps 234b are provided on the interconnect substrate 21-facing surface of the second semiconductor chip 234.

The columnar electrodes 241, 242, 243, 244 are provided on the interconnect substrate 21. The columnar electrodes 241, 242, 243, 244 each include a wire extending upright from the interconnect substrate 21.

The columnar electrodes 241 are provided at positions corresponding to the positions of the second metal bumps 231b of the second semiconductor chip 231. The front end of each columnar electrode 241 is inserted into the corresponding second metal bump 231b. The columnar electrodes 242 are provided at positions corresponding to the positions of the second metal bumps 232b of the second semiconductor chip 232. The front end of each columnar electrode 242 is inserted into the corresponding second metal bump 232b.

The columnar electrodes 243 are provided at positions corresponding to the positions of the second metal bumps 233b of the second semiconductor chip 233. The front end of each columnar electrode 243 is inserted into the corresponding second metal bump 233b. The columnar electrodes 244 are provided at positions corresponding to the positions of the second metal bumps 234b of the second semiconductor chip 234. The front end of each columnar electrode 244 is inserted into the corresponding second metal bump 234b.

The molded resin layer 25 is provided on the interconnect substrate 21. The molded resin layer 25 covers the first semiconductor chip 22, the second semiconductor chips 231, 232, 233, 234, and the columnar electrodes 241, 242, 243, 244.

The diameter of the first end part which is the end part on the interconnect substrate 21 side of the columnar electrodes 241, 242, 243, 244 is larger than the diameter of the center part of the columnar electrodes 241, 242, 243, 244.

The metal balls 26 are provided on the surface of the interconnect substrate 21 opposite to the surface on which the first semiconductor chip 22 is mounted.

As used herein, X direction and Y direction refer to directions parallel to the surface of the interconnect substrate 21, etc., and perpendicular to each other, and Z direction refers to a direction perpendicular to the surface of the interconnect substrate 21, etc. +Z direction is defined as the upward direction, and −Z direction is defined as the downward direction. Thus, for example, the first semiconductor chip 22 is located above the interconnect substrate 21 and below the second semiconductor chip 231. The −Z direction may or may not coincide with the gravitational direction.

Figures 2, 3:
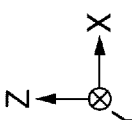
FIG. 2 is a diagram illustrating a method for manufacturing the semiconductor device according to the first embodiment.
FIG. 3 is a diagram illustrating the method for manufacturing the semiconductor device according to the first embodiment.

A method for manufacturing the semiconductor device 2 will now be described with reference to FIGS. 2 through 12. As shown in FIG. 2, an interconnect substrate 21 is prepared. The interconnect substrate 21 internally has interconnect layers 211.

Subsequently, as shown in FIG. 3, first metal bumps 27 are formed on a first semiconductor chip 22. The first semiconductor chip 22 is flip-chip mounted via the first metal bumps 27 to pads (not shown) formed on the interconnect substrate 21. An elemental metal such as Sn, Ag, Cu, Au, Pd, Bi, Zn, Ni, Sb, In or Ge, or a composite film or an alloy composed of two or more of such metals is used for the first metal bumps 27. The flip-chip mounting may be performed by a reflow process using a flux, or by a thermal compression bonding process. The reflow process may be performed in a reducing atmosphere. It is also possible to use a method involving temporary compression bonding with an FC bonder, followed by heating under pressure by laser reflow.

Subsequently, as shown in FIG. 4, a first resin is poured into the space between the interconnect substrate 21 and the first semiconductor chip 22 to form a first resin layer 28. A resin such as a phenol resin, a polyimide resin, a polyamide resin, an acrylic resin, an epoxy resin, a PBO (p-phenylenebenzobisoxazole) resin, a silicone resin or a benzocyclobutene resin, or a mixed or composite material containing a combination of such resins is used as the first resin that forms the first resin layer 28. It is also possible to perform flip-chip mounting and resin sealing simultaneously using an NCP (non-conductive paste), an NCF (non-conductive film), or the like.

Subsequently, as shown in FIG. 5, columnar electrodes 241, 242, 243, 244 are formed on the interconnect substrate 21. An elemental metal such as Cu, Ni, W, Au, Ag, Pd, Sn, Bi, Zn, Cr, Al or Ti, a composite material composed of two or more of them, or an alloy composed of two or more of them is used as a material for the columnar electrodes 241, 242, 243, 244. Preferably, Au, Ag, Cu, or CuPd may be used as a material for the columnar electrodes 241, 242, 243, 244. More preferably, Cu or CuPd, which is a hard material, may be used as a material for the columnar electrodes 241, 242, 243, 244. A metal material containing Cu covered with Pd may be used as a material for the columnar electrodes 241, 242, 243, 244. The use of such a material makes the columnar electrodes unlikely to fall upon the formation of a molded resin layer.

Figure 6:
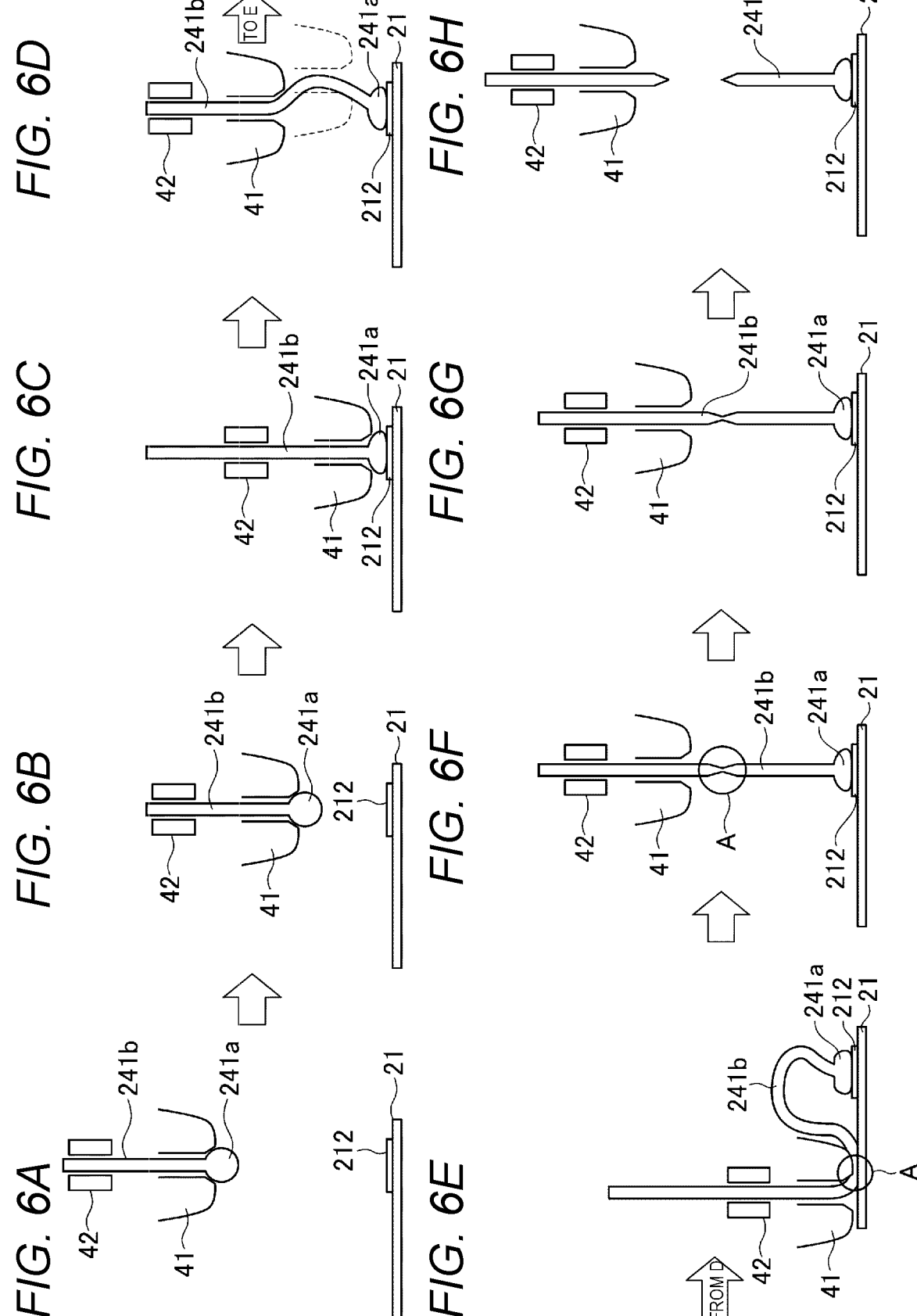
FIGS. 6A-6H are diagrams illustrating the method for manufacturing the semiconductor device according to the first embodiment.

A method for forming the columnar electrodes 241, 242, 243, 244 will now be described in detail with reference to FIG. 6. FIG. 6 illustrates the formation of a columnar electrode 241 as an example. FIG. 6 illustrates sequential process steps A to H for the formation of the columnar electrode 241.

As shown in FIG. 6A, a wire 241b fed from a wire clamp 42 is held by a capillary 41. The front end of the wire 241b, held by the capillary 41, is processed into a ball-like shape to form a front end portion 241a. An electrode pad 212 is provided on the interconnect substrate 21. An elemental metal such as Al, Cu, Au, Ni or Pd, or a composite film or an alloy containing a combination of such metals is used for the electrode pad 212.

Subsequently, as shown in FIG. 6B, the capillary 41 and the wire clamp 42 are moved toward the electrode pad 212 until the front end portion 241a reaches a position just above the electrode pad 212. Subsequently, as shown in FIG. 6C, the capillary 41 and the wire clamp 42 are lowered to bring the front end portion 241a into contact with the electrode pad 212. Ultrasonic waves are applied to the front end portion 241a while keeping it in contact with the electrode pad 212, thereby bonding the front end portion 241a to the electrode pad 212.

Subsequently, as shown in FIG. 6D, the wire 241b is fed from the capillary 41 and the wire clamp 42 according to the intended height of the eventual columnar electrode. Subsequently, as shown in FIG. 6E, the capillary 41 is pressed against the interconnect substrate 21 at a position at a predetermined distance from the center of the electrode pad 212. The predetermined distance is set to be 50% to 90% of the intended height of the eventual columnar electrode. The predetermined distance is preferably set to a constant value in order to stabilize the height of the eventual columnar electrode.

Subsequently, as shown in FIG. 6F, the capillary 41 and the wire clamp 42 are raised to erect the wire 241b. When the capillary 41 and the wire clamp 42 are further raised as shown in FIG. 6G, the wire 241b is cut at the position A at which the capillary 41 was pressed against the interconnect substrate 21 as shown in FIG. 6E. Finally, as shown in FIG.

6H, a columnar electrode 241, including the cut wire 241b and the front end portion 241a, is formed.

Figure 7:
FIG. 7 is a diagram illustrating the method for manufacturing the semiconductor device according to the first embodiment.

Subsequently, as shown in FIG. 7, a second semiconductor chip 231, having electrode pads 231a formed thereon, is prepared. An elemental metal such as Al, Cu, Au, Ni or Pd, or a composite film or an alloy containing a combination of such metals is used for the electrode pads 231a. Similarly, though not shown diagrammatically, second semiconductor chips 232, 233, 234, each having electrode pads formed thereon, are prepared.

Figure 8:
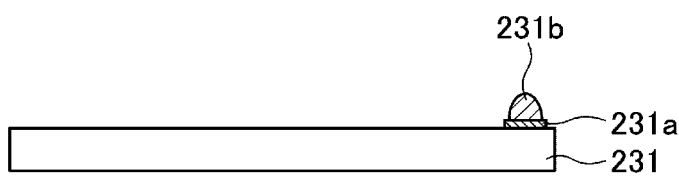
FIG. 8 is a diagram illustrating the method for manufacturing the semiconductor device according to the first embodiment.

Subsequently, as shown in FIG. 8, second metal bumps 231b are formed on the electrode pads 231a. Similarly, though not shown diagrammatically, second metal bumps 232b, 233b, 234b are formed on the electrode pads of the second semiconductor chips 232, 233, 234. An elemental metal such as Sn, Ag, Cu, Au, Pd, Bi, Zn, Ni, Sb, In or Ge, or a composite film or an alloy composed of two or more of such metals is used for the second metal bumps 231b, 232b, 233b, 234b.

Subsequently, as shown in FIG. 9, a second resin layer 29 is formed on the back surface of the first semiconductor chip 22. A resin such as a phenol resin, a polyimide resin, a polyamide resin, an acrylic resin, an epoxy resin, a PBO (p-phenylenebenzobisoxazole) resin, a silicone resin or a benzocyclobutene resin, or a mixed or composite material containing a combination of such resins is used as a second resin that forms the second resin layer 29. The second resin layer 29 may be formed by applying the second resin in a liquid form to the first semiconductor chip 22, or by attaching the second resin in the form of a film to the first semiconductor chip 22.

Subsequently, as shown in FIG. 10, the second semiconductor chip 231 is mounted on the second resin layer 29. As described above with reference to FIGS. 7 and 8, the second metal bumps 231b have been formed on the second semiconductor chip 231. When mounting the second semiconductor chip 231 on the second resin layer 29, the front end of each columnar electrode 241 is bonded to the corresponding second metal bump 231b. The bonding may be performed, for example, by applying a flux to the second metal bumps 231b, and mounting the second semiconductor chip 231, followed by reflowing or by thermal compression bonding with an FC bonder. The reflowing may be performed in a reducing atmosphere. It is also possible to use a method involving temporary compression bonding with an FC bonder, followed by heating under pressure by laser reflow.

Figure 11:
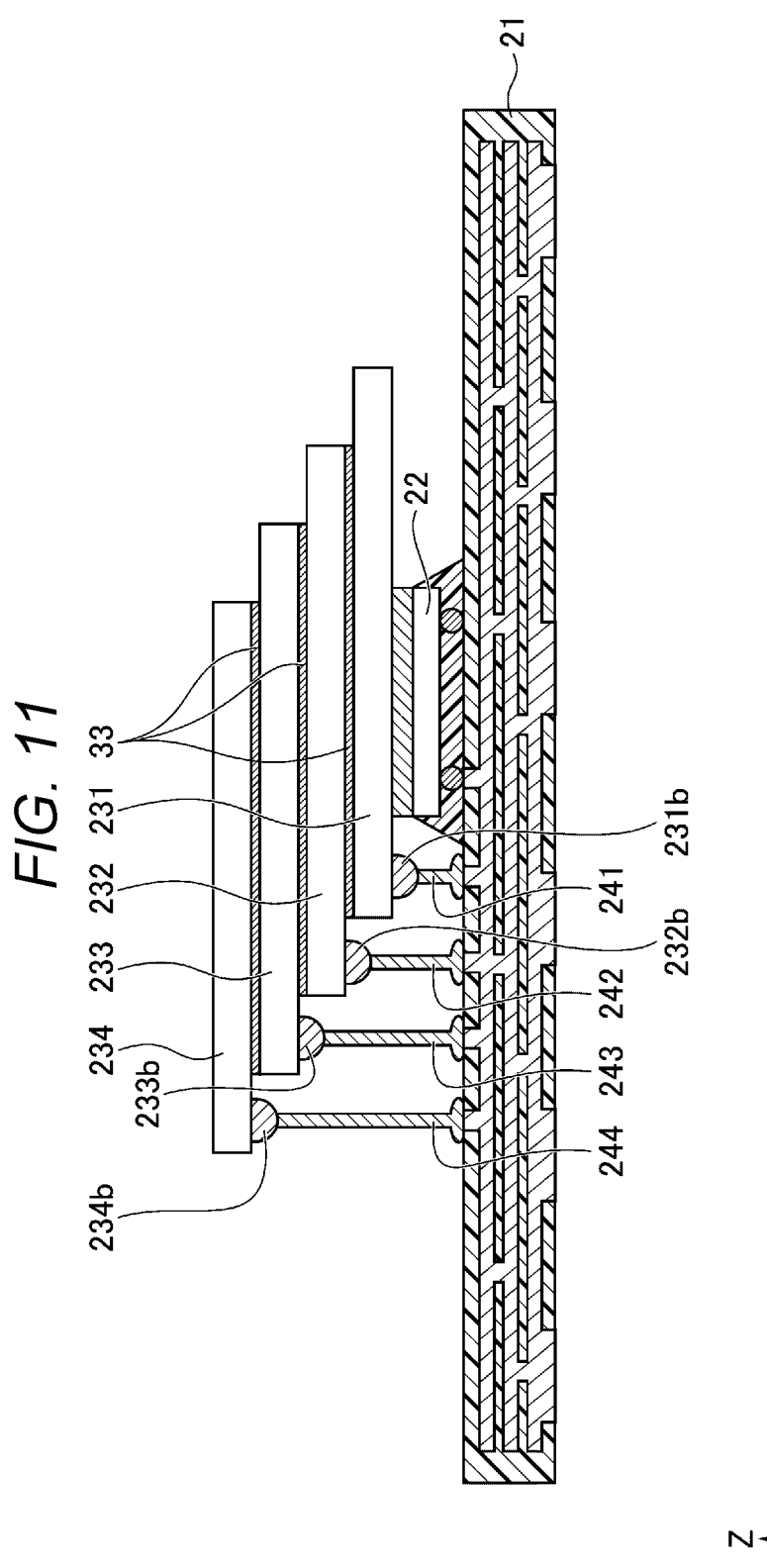
FIG. 11 is a diagram illustrating the method for manufacturing the semiconductor device according to the first embodiment.

Subsequently, as shown in FIG. 11, a third resin layer 33 is formed on the second semiconductor chip 231. A resin such as a phenol resin, a polyimide resin, a polyamide resin, an acrylic resin, an epoxy resin, a PBO (p-phenylenebenzobisoxazole) resin, a silicone resin or a benzocyclobutene resin, or a mixed or composite material containing a combination of such resins is used as a third resin that forms the third resin layer 33. The third resin layer 33 may be formed by applying the third resin in a liquid form to the second semiconductor chip 231, or by attaching the third resin in the form of a film to the second semiconductor chip 231.

The second semiconductor chip 232 is mounted on the third resin layer 33 formed on the second semiconductor chip 231. The second metal bumps 232b have been formed on the second semiconductor chip 232. The second semiconductor chip 232 is placed on the second semiconductor chip 231 in a shifted manner such that the second metal bumps 232b are located at positions corresponding to the columnar electrodes 242. When mounting the second semiconductor chip 232 on the third resin layer 33, the front end of each columnar electrode 242 is bonded to the corresponding second metal bump 232*b*. The bonding may be performed, for example, by applying a flux to the second metal bumps 232*b*, and mounting the second semiconductor chip 232, followed by reflowing or by thermal compression bonding with an FC bonder. The reflowing may be performed in a reducing atmosphere. It is also possible to use a method involving temporary compression bonding with an FC bonder, followed by heating under pressure by laser reflow.

A third resin layer 33 is formed on the second semiconductor chip 232. The third resin layer 33 can be formed by the above-described method using the same material as that described above. The second semiconductor chip 233 is mounted on the third resin layer 33 formed on the second semiconductor chip 232. When mounting the second semiconductor chip 233, it is placed on the second semiconductor chip 232 in a shifted manner such that the second metal bumps 233*b* are located at positions corresponding to the columnar electrodes 243. When mounting the second semiconductor chip 233 on the third resin layer 33, the front end of each columnar electrode 243 is bonded to the corresponding second metal bump 233*b*. The bonding can be performed in the manner described above.

A third resin layer 33 is formed on the second semiconductor chip 233. The third resin layer 33 can be formed by the above-described method using the same material as that described above. The second semiconductor chip 234 is mounted on the third resin layer 33 formed on the second semiconductor chip 233. When mounting the second semiconductor chip 234, it is placed on the second semiconductor chip 233 in a shifted manner such that the second metal bumps 234*b* are located at positions corresponding to the columnar electrodes 244. When mounting the second semiconductor chip 234 on the third resin layer 33, the front end of each columnar electrode 244 is bonded to the corresponding second metal bump 234*b*. The bonding can be performed in the manner described above.

Figure 12:
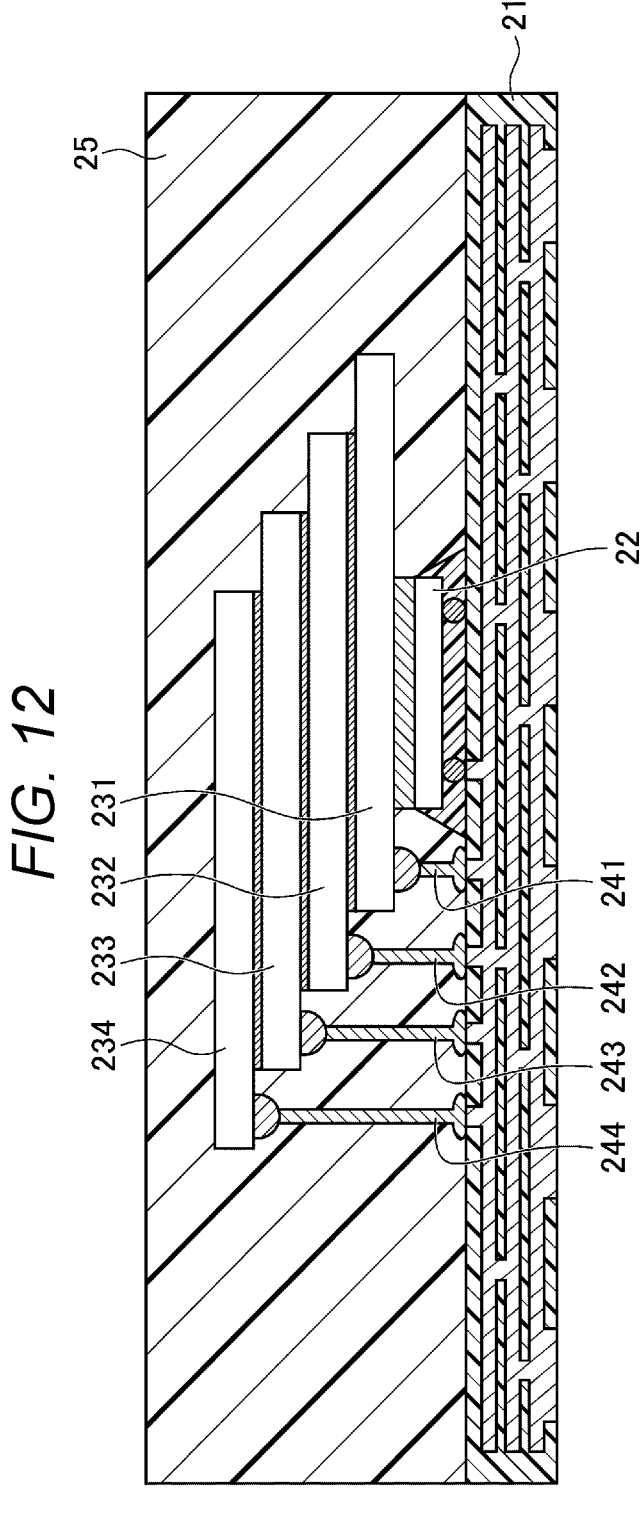
FIG. 12 is a diagram illustrating the method for manufacturing the semiconductor device according to the first embodiment.

Subsequently, as shown in FIG. 12, a molded resin layer 25 is formed. The molded resin layer 25 is formed such that it covers the first semiconductor chip 22, the second semiconductor chips 231, 232, 233, 234, and the columnar electrodes 241, 242, 243, 244. A resin such as an epoxy resin, a phenol resin, a polyimide resin, a polyamide resin, an acrylic resin, a PBO resin, a silicone resin or a benzocyclobutene resin, or a mixed or composite material containing a combination of such resins is used as a molding resin that forms the molded resin layer 25. There is no particular limitation on the epoxy resin. Examples of the epoxy resin include bisphenol-type epoxy resins such as a bisphenol A-type epoxy resin, a bisphenol F-type epoxy resin, a bisphenol AD-type epoxy resin, and a bisphenol S-type epoxy resin, novolac-type epoxy resins such as a phenol novolac-type epoxy resin and a cresol novolac-type epoxy resin, aromatic epoxy resins such as a resorcinol-type epoxy resin and trisphenolmethane triglycidyl ether, naphthalene-type epoxy resins, fluorene-type epoxy resins, dicyclopentadiene-type epoxy resins, polyether-modified epoxy resins, benzophenone-type epoxy resins, aniline-type epoxy resins, NBR-modified epoxy resins, CTBN-modified epoxy resins, and hydrogenated products of these resins. Among them, naphthalene-type epoxy resins and dicyclopentadiene-type epoxy resins are preferred because of their good adhesion to Si. Benzophenone-type epoxy resins are also preferred because of their rapid curing properties. These epoxy resins may be used singly or in a combination of two or more. The molding resin may contain a filler such as silica.

The molding resin is cured by heating e.g., with an oven or, in the case of a UV-curing resin, by irradiation with UV light.

Subsequently, as shown in FIG. 1, metal balls 26 are formed on the back surface of the interconnect substrate 21, followed by dicing to complete the semiconductor device 2. An elemental metal such as Sn, Ag, Cu, Au, Pd, Bi, Zn, Ni, Sb, In or Ge, or a composite film or an alloy composed of two or more of such metals is used for the metal balls 26.

Figure 13:
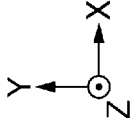
FIG. 13 is a diagram illustrating the semiconductor device according to the first embodiment.

An arrangement of the interconnect substrate 21 and the second semiconductor chips 231, 232, 233, 234 in the semiconductor device 2 will now be described with reference to FIG. 13. FIG. 13 is a plan view of the semiconductor device 2 as viewed in the Z direction. As described above with reference to FIGS. 1 through 12, the second semiconductor chips 231, 232, 233, 234 are shifted in the X direction so that the second metal bumps 231*b*, 232*b*, 233*b*, 234*b* can face the interconnect substrate 21. On the other hand, the second semiconductor chips 231, 232, 233, 234 are not shifted in the Y direction, i.e., arranged such that their sides along the X direction are aligned.

A semiconductor device 2 was manufactured by the above-described process and mounted on an interconnect substrate, and it was subjected to a temperature cycle test to determine the reliability. The temperature cycle test was conducted by repeating the cycle: −55° C. (30 min)-25° C. (5 min)-125° C. (30 min). As a result, no cracking or breakage was observed in the joint portions of the semiconductor device 2 even after 3000 cycles.

Unlike the conventional semiconductor device in which columnar electrodes are formed on semiconductor chips, the columnar electrodes 241, 242, 243, 244 are formed on the interconnect substrate 21. This can prevent damage to the second semiconductor chips 231, 232, 233, 234.

While wires are used as the columnar electrodes 241, 242, 243, 244, columnar electrodes may be formed by plating. Columnar electrodes formed by wiring and columnar electrodes formed by plating may be co-present. Like a common article using wire bonding, wires that directly connect chips and columnar electrodes using wires may, of course, be co-present. Wires that directly connect chips and columnar electrodes formed, for example, by plating may be co-present. Wires that directly connect chips, columnar electrodes using wires, and columnar electrodes formed, for example, by plating may be co-present.

The second semiconductor chip 231 may be mounted on the interconnect substrate 21 without forming the second resin layer 29. In that case, the molded resin layer 25 is formed between the back surface of the first semiconductor chip 22 and the second semiconductor chip 231.

The first semiconductor chip 22 may be a NAND flash memory chip, and the second semiconductor chip 231 may be a controller chip.

Figure 14:
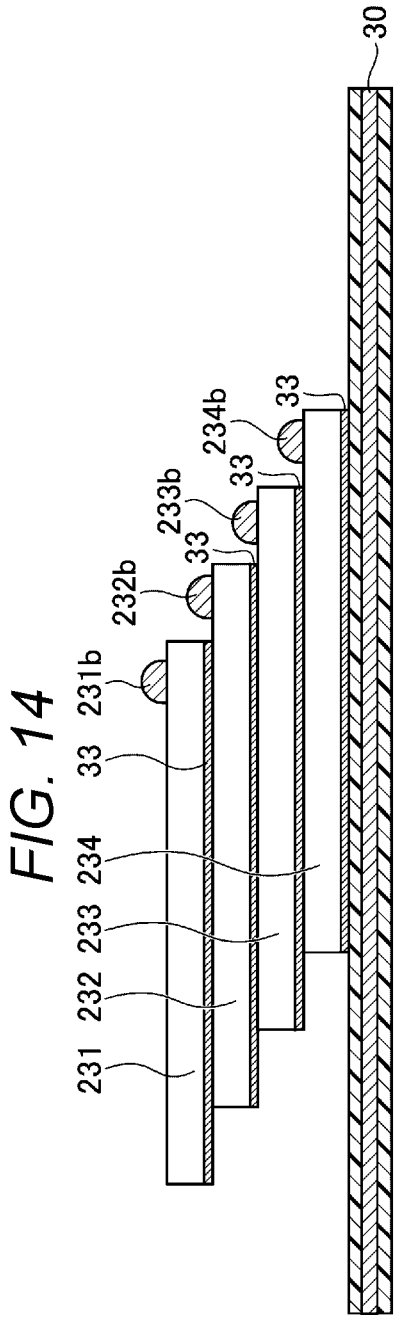
FIG. 14 is a diagram illustrating a variation of the method for manufacturing the semiconductor device according to the first embodiment.

A method for manufacturing a semiconductor device 2A (see FIG. 17), which is a variation of the semiconductor device 2, will now be described with reference to FIGS. 14 through 17. As shown in FIG. 14, a support plate 30 is prepared. A silicon plate, a glass plate, a ceramic plate, a resin plate, a metal plate such as a lead frame, or the like is used as the support plate 30. A second semiconductor chip 234 is mounted via a third resin layer 33 on the interconnect substrate 21-facing surface of the support plate 30. A resin such as a phenol resin, a polyimide resin, a polyamide resin, an acrylic resin, an epoxy resin, a PBO (p-phenylenebenzobisoxazole) resin, a silicone resin or a benzocyclobutene resin, or a mixed or composite material containing a combination of such resins is used as a third resin that forms the third resin layer 33. The third resin layer 33 may be formed either on the support plate 30 or on the back surface of the second semiconductor chip 234.

A second semiconductor chip 233 is mounted on the second semiconductor chip 234 via a third resin layer 33 in a shifted manner such that second metal bumps 234b, provided on the second semiconductor chip 234, are exposed. A second semiconductor chip 232 is mounted on the second semiconductor chip 233 via a third resin layer 33 in a shifted manner such that second metal bumps 233b, provided on the second semiconductor chip 233, are exposed. A second semiconductor chip 231 is mounted on the second semiconductor chip 232 via a third resin layer 33 in a shifted manner such that second metal bumps 232b, provided on the second semiconductor chip 232, are exposed.

Figure 15:
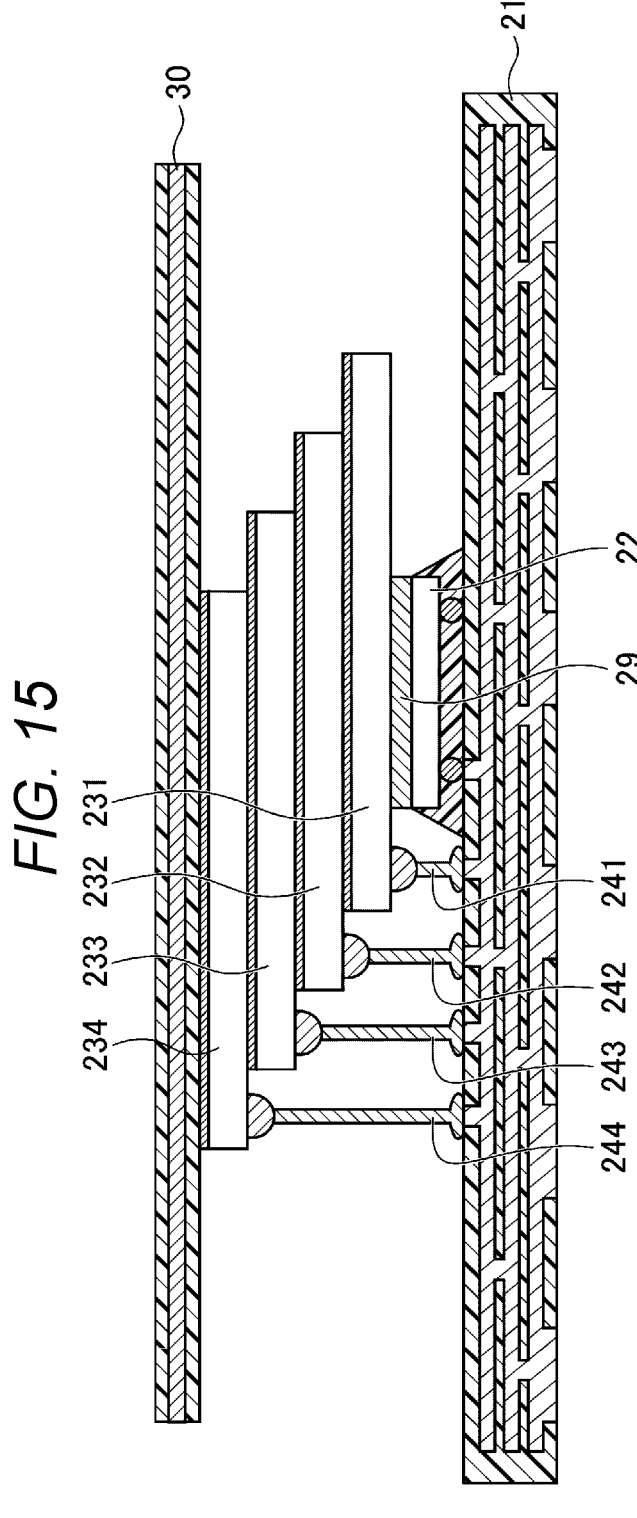
FIG. 15 is a diagram illustrating the variation of the method for manufacturing the semiconductor device according to the first embodiment.

As shown in FIG. 15, the interconnect substrate 21, described above with reference to FIG. 9, is prepared. The interconnect substrate 21 is provided with the first semiconductor chip 22, the columnar electrodes 241, 242, 243, 244, etc. The support plate 30 and the second semiconductor chips 231, 232, 233, 234, described above with reference to FIG. 14, are mounted on the interconnect substrate 21. The second semiconductor chip 231 and the first semiconductor chip 22 are bonded together via a second resin layer 29. A resin such as a phenol resin, a polyimide resin, a polyamide resin, an acrylic resin, an epoxy resin, a PBO (p-phenylenebenzobisoxazole) resin, a silicone resin or a benzocyclobutene resin, or a mixed or composite material containing a combination of such resins is used as a second resin that forms the second resin layer 29.

The second metal bumps 231b, 232b, 233b, 234b are bonded to the front ends of the columnar electrodes 241, 242, 243, 244. The bonding may be performed, for example, by applying a flux to the second metal bumps 231b, 232b, 233b, 234b, and mounting the second semiconductor chips 231, 232, 233, 234, followed by reflowing or by thermal compression bonding with an FC bonder. The reflowing may be performed in a reducing atmosphere. It is also possible to use a method involving temporary compression bonding with an FC bonder, followed by heating under pressure by laser reflow.

Subsequently, as shown in FIG. 16, a molded resin layer 25 is formed. The molded resin layer 25 is formed such that it covers the first semiconductor chip 22, the second semiconductor chips 231, 232, 233, 234, the columnar electrodes 241, 242, 243, 244, and the support plate 30. A resin such as an epoxy resin, a phenol resin, a polyimide resin, a polyamide resin, an acrylic resin, a PBO resin, a silicone resin or a benzocyclobutene resin, or a mixed or composite material containing a combination of such resins is used as a molding resin that forms the molded resin layer 25. There is no particular limitation on the epoxy resin. Examples of the epoxy resin include bisphenol-type epoxy resins such as a bisphenol A-type epoxy resin, a bisphenol F-type epoxy resin, a bisphenol AD-type epoxy resin, and a bisphenol S-type epoxy resin, novolac-type epoxy resins such as a phenol novolac-type epoxy resin and a cresol novolac-type epoxy resin, aromatic epoxy resins such as a resorcinol-type epoxy resin and trisphenolmethane triglycidyl ether, naphthalene-type epoxy resins, fluorene-type epoxy resins, dicyclopentadiene-type epoxy resins, polyether-modified epoxy resins, benzophenone-type epoxy resins, aniline-type epoxy resins, NBR-modified epoxy resins, CTBN-modified epoxy resins, and hydrogenated products of these resins. Among them, naphthalene-type epoxy resins and dicyclopentadiene-type epoxy resins are preferred because of their good adhesion to Si. Benzophenone-type epoxy resins are also preferred because of their rapid curing properties. These epoxy resins may be used singly or in a combination of two or more. The molding resin may contain a filler such as silica. The molding resin is cured by heating e.g., with an oven or, in the case of a UV=curing resin, by irradiation with UV light.

Figure 17:
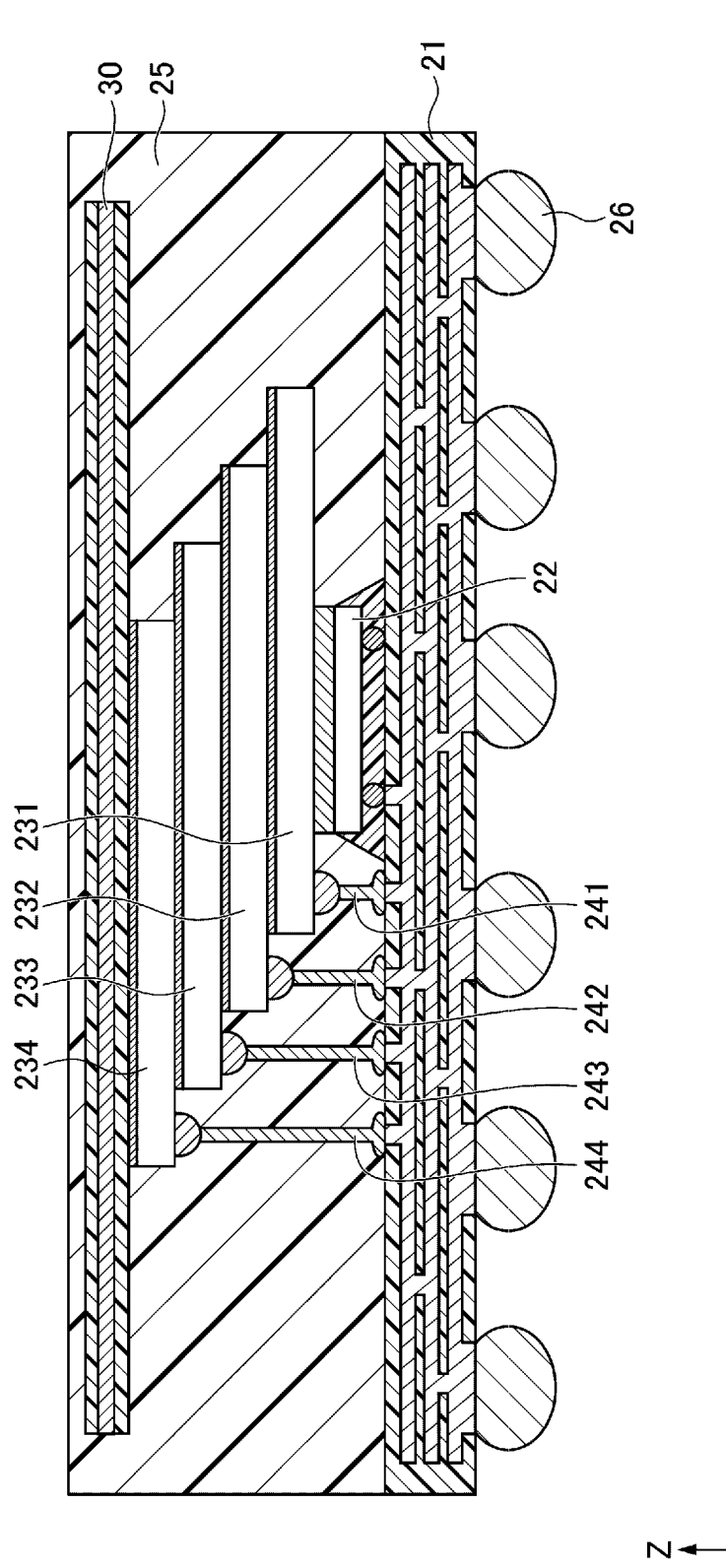
FIG. 17 is a diagram illustrating the variation of the method for manufacturing the semiconductor device according to the first embodiment.

Subsequently, as shown in FIG. 17, metal balls 26 are formed on the back surface of the interconnect substrate 21, followed by dicing to complete the semiconductor device 2A. An elemental metal such as Sn, Ag, Cu, Au, Pd, Bi, Zn, Ni, Sb, In or Ge, or a composite film or an alloy composed of two or more of such metals is used for the metal balls 26.

A semiconductor device 2A was manufactured by the above-described process and mounted on an interconnect substrate, and it was subjected to a temperature cycle test to determine the reliability. The temperature cycle test was conducted by repeating the cycle: −55° C. (30 min)-25° C. (5 min)-125° C. (30 min). As a result, no cracking or breakage was observed in the joint portions of the semiconductor device 2A even after 3000 cycles.

Unlike the conventional semiconductor device in which columnar electrodes are formed on semiconductor chips, the columnar electrodes 241, 242, 243, 244 are formed on the interconnect substrate 21. This can prevent damage to the second semiconductor chips 231, 232, 233, 234.

While wires are used as the columnar electrodes 241, 242, 243, 244, columnar electrodes may be formed by plating. Columnar electrodes formed by wiring and columnar electrodes formed by plating may be co-present. Like a common article using wire bonding, wires that directly connect chips and columnar electrodes using wires may, of course, be co-present. Wires that directly connect chips and columnar electrodes formed, for example, by plating may be co-present. Wires that directly connect chips, columnar electrodes using wires, and columnar electrodes formed, for example, by plating may be co-present.

The second semiconductor chip 231 may be mounted on the interconnect substrate 21 without forming the second resin layer 29. In that case, the molded resin layer 25 is formed between the back surface of the first semiconductor chip 22 and the second semiconductor chip 231.

The first semiconductor chip 22 may be a NAND flash memory chip, and the second semiconductor chip 231 may be a controller chip.

A semiconductor device, which is a variation of the first embodiment, will now be described with reference to FIG. 18. FIG. 18 is a diagram corresponding to FIG. 11 that illustrates the first embodiment. The variation shown in FIG. 18 differs from the first embodiment shown in FIG. 11 in that instead of the second metal bumps 231b, 232b, 233b, 234b, the variation is provided with pillar bumps 231c, 232c, 233c, 234c and low-melting metal portions 231d, 232d, 233d, 234d.

The pillar bumps 231c are formed on the second semiconductor chip 231, and then each low-melting metal portion 231d is formed on each pillar bump 231c. Similarly, the pillar bumps 232c are formed on the second semiconductor chip 232, and then each low-melting metal portion 232d is formed on each pillar bump 232c. The pillar bumps 233c are formed on the second semiconductor chip 233, and then each low-melting metal portion 233d is formed on each pillar bump 233c. The pillar bumps 234c are formed on the second semiconductor chip 234, and then each low-melting metal portion 234d is formed on each pillar bump 234c.

An elemental metal such as Ag, Cu, Au, Pd or Ni, or a composite film or an alloy composed of two or more of such metals is used for the pillar bumps 231c, 232c, 233c, 234c. An elemental metal such as Sn, Ag, Cu, Au, Pd, Bi, Zn, Ni, Sb, In or Ge, or a composite film or an alloy composed of two or more of such metals is used for the low-melting metal portions 231d, 232d, 233d, 234d.

The provision of the pillar bumps 231c, 232c, 233c, 234c can increase the distance of the joint portions with the columnar electrodes 241, 242, 243, 244 from the surfaces of the second semiconductor chips 231, 232, 233, 234. This can reduce the influence of the strain on the joint portions, caused by the difference in coefficient of thermal expansion between the second semiconductor chips 231, 232, 233, 234 and the interconnect substrate 21, thereby enhancing the reliability. This also enables the advancement of smaller pitch of the pillar bumps or the columnar electrodes. By making the diameter of the pillar bumps 231c, 232c, 233c, 234c larger than the diameter of the columnar electrodes 241, 242, 243, 244, stresses generated in various portions can be reduced.

A semiconductor device, which is a variation of the first embodiment, will now be described with reference to FIG. 19. FIG. 19 is a diagram corresponding to FIG. 11 that illustrates the first embodiment. The variation shown in FIG. 19 differs from the first embodiment shown in FIG. 11 in that the variation is provided with a fourth resin layer 31 that covers the joint portions between the columnar electrodes 241, 242, 243, 244 and the electrode pads 212 of the interconnect substrate 21.

A resin such as an epoxy resin, a phenol resin, a polyimide resin, a polyamide resin, an acrylic resin, a PBO resin, a silicone resin or a benzocyclobutene resin, or a mixed or composite material containing a combination of such resins is used as a fourth resin that forms the fourth resin layer 31. The provision of the fourth resin layer 31 can prevent the columnar electrodes 241, 242, 243, 244 from falling upon the formation of the molded resin layer 25, thereby enhancing the reliability.

A semiconductor device, which is a variation of the first embodiment, will now be described with reference to FIG. 20. FIG. 20 is a diagram corresponding to FIG. 11 that illustrates the first embodiment. The variation shown in FIG. 20 differs from the first embodiment shown in FIG. 11 in that the variation is provided with a stepped portion 32 in an area of the interconnect substrate 21 where the columnar electrodes are provided. The stepped portion 32 has a configuration that follows the configuration of the steps formed by the second semiconductor chips 232, 233, 234. The stepped portion 32 includes a first step 322, a second step 323, and a third step 324. An internal interconnect 322a is provided in the first step 322. An internal interconnect 323a is provided in the second step 323. An internal interconnect 324a is provided in the third step 324. Though not shown diagrammatically, electrode pads connecting with the internal interconnect 322a are provided on the surface of the first step 322. Similarly, electrode pads connecting with the internal interconnect 323a are provided on the surface of the second step 323. Electrode pads connecting with the internal interconnect 324a are provided on the surface of the third step 324.

Columnar electrodes 241D are provided on the interconnect substrate 21. The columnar electrodes 241D connect with the second metal bumps 231b provided on the second semiconductor chip 231. Columnar electrodes 242D are provided on the electrode pads provided on the first step 322. The columnar electrodes 242D connect with the second metal bumps 232b provided on the second semiconductor chip 232.

Columnar electrodes 243D are provided on the electrode pads provided on the second step 323. The columnar electrodes 243D connect with the second metal bumps 233b provided on the second semiconductor chip 233. Columnar electrodes 244D are provided on the electrode pads provided on the third step 324. The columnar electrodes 244D connect with the second metal bumps 234b provided on the second semiconductor chip 234.

All the columnar electrodes 241D, 242D, 243D, 244D have the same length. The electrical properties of the columnar electrodes 241D, 242D, 243D, 244D can be enhanced by equalizing their lengths. If the number of stacked chips is large, it is necessarily to form long columnar electrodes. The configuration described above can eliminate the need for the formation of long columnar electrodes, thereby preventing fall of columnar electrodes.

A method for manufacturing a semiconductor device 2E (see FIG. 28) according to a second embodiment will now be described with reference to FIGS. 21 through 28. As shown in FIG. 21, a stack of a glass support 51, a release layer 52, and a metal layer 53 is prepared. A resin such as an epoxy resin, a phenol resin, a polyimide resin, a polyamide resin, an acrylic resin, a PBO resin, a silicone resin or a benzocyclobutene resin, or a mixed or composite material containing a combination of such resins is used for the release layer 52. An elemental metal such as Al, Cu, Au, Ni, Pd, Ti or Cr, or a composite film or an alloy containing a combination of such metals is used for the metal layer 53.

Subsequently, as shown in FIG. 22, columnar electrodes 242, 243, 244 are formed on the metal layer 53. Subsequently, as shown in FIG. 23, second semiconductor chips 231, 232, 233, 234 are stacked on the metal layer 53.

The second semiconductor chip 231 is mounted on the metal layer 53 via a third resin layer 33. The same resins as those described above may be used as a third resin that forms the third resin layer 33, and therefore a description thereof is omitted. Metal pillars 54 are provided between the second semiconductor chip 231 and the metal layer 53. An elemental metal such as Ag, Cu, Au, Pd or Ni, or a composite film or an alloy composed of two or more of such metals is used for the metal pillars 54.

The second semiconductor chip 232 is mounted on a third resin layer 33 formed on the second semiconductor chip 231. Second metal bumps 232b have been formed on the second semiconductor chip 232. An elemental metal such as Sn, Ag, Cu, Au, Pd, Bi, Zn, Ni, Sb, In or Ge, or a composite film or an alloy composed of two or more of such metals is used for the second metal bumps 232b. Instead of such a metal bump, it is possible to use a combination of a pillar bump and a low-melting metal portion. An elemental metal such as Ag, Cu, Au, Pd or Ni, or a composite film or an alloy composed of two or more of such metals is used for the pillar bumps. An elemental metal such as Sn, Ag, Cu, Au, Pd, Bi, Zn, Ni, Sb, In or Ge, or a composite film or an alloy composed of two or more of such metals is used for the low-melting metal portions. The second semiconductor chip 232 is placed on the second semiconductor chip 231 in a shifted manner such that the second metal bumps 232b are located at positions corresponding to the columnar electrodes 242. When mounting the second semiconductor chip 232 on the third resin layer 33, the front end of each columnar electrode 242 is bonded to the corresponding second metal bump 232b. The bonding may be performed, for example, by applying a flux to the second metal bumps 232b, and mounting the second semiconductor chip 232, followed by reflowing or by thermal compression bonding with an FC bonder. The reflowing may be performed in a reducing atmosphere. It is also possible to use a method involving temporary compression bonding with an FC bonder, followed by heating under pressure by laser reflow.

A third resin layer 33 is formed on the second semiconductor chip 232. The third resin layer 33 can be formed by the above-described method using the same material as that described above. The second semiconductor chip 233 is mounted on the third resin layer 33 formed on the second semiconductor chip 232. When mounting the second semiconductor chip 233, it is placed on the second semiconductor chip 232 in a shifted manner such that the second metal bumps 233b are located at positions corresponding to the columnar electrodes 243. When mounting the second semiconductor chip 233 on the third resin layer 33, the front end of each columnar electrode 243 is bonded to the corresponding second metal bump 233b. The bonding can be performed in the manner described above.

A third resin layer 33 is formed on the second semiconductor chip 233. The third resin layer 33 can be formed by the above-described method using the same material as that described above. The second semiconductor chip 234 is mounted on the third resin layer 33 formed on the second semiconductor chip 233. When mounting the second semiconductor chip 234, it is placed on the second semiconductor chip 233 in a shifted manner such that the second metal bumps 234b are located at positions corresponding to the columnar electrodes 244. When mounting the second semiconductor chip 234 on the third resin layer 33, the front end of each columnar electrode 244 is bonded to the corresponding second metal bump 234b. The bonding can be performed in the manner described above.

Subsequently, as shown in FIG. 24, a molded resin layer 25 is formed. The molded resin layer 25 is formed such that it covers the second semiconductor chips 231, 232, 233, 234 and the columnar electrodes 242, 243, 244. The same resins as those described above may be used as a molding resin that forms the molded resin layer 25, and therefore a description thereof is omitted.

Subsequently, as shown in FIG. 25, the glass support 51 is peeled off by laser peeling. Subsequently, as shown in FIG. 26, the release layer 52 and the metal layer 53 are removed. Subsequently, as shown in FIG. 27, the chip package is mounted on an interconnect substrate 21E which is, for example, an organic substrate. The interconnect substrate 21E may also be a rewiring substrate.

Subsequently, as shown in FIG. 28, a molded resin layer 25E is formed. Metal balls 26 are formed on the back surface of the interconnect substrate 21E, followed by dicing to complete the semiconductor device 2E.

A semiconductor device 2F, which is a variation of the second embodiment, will now be described with reference to FIGS. 29 and 30. FIG. 29 is a diagram corresponding to FIG. 27. As shown in FIG. 29, an interconnect substrate 21F may be used instead of the interconnect substrate 21E. The interconnect substrate 21F is a rewiring substrate. Subsequently, as shown in FIG. 30, a molded resin layer 25 is formed. Metal balls 26 are formed on the back surface of the interconnect substrate 21F, followed by dicing to complete the semiconductor device 2F.

A different method for manufacturing the semiconductor device 2F will now be described with reference to FIGS. 31 through 35. As shown in FIG. 31, a stack of a glass support 51, a release layer 52, and the interconnect substrate 21F is prepared. The interconnect substrate 21F is a rewiring substrate.

Subsequently, as shown in FIG. 32, columnar electrodes 242, 243, 244 are formed on the interconnect substrate 21F.

Subsequently, as shown in FIG. 33, second semiconductor chips 231, 232, 233, 234 are stacked on the interconnect substrate 21F.

The second semiconductor chip 231 is mounted on the interconnect substrate 21F via a third resin layer 33. The same resins as those described above may be used as a third resin that forms the third resin layer 33, and therefore a description thereof is omitted. Metal pillars 54 are provided between the second semiconductor chip 231 and the interconnect substrate 21F.

The second semiconductor chip 232 is mounted on a third resin layer 33 formed on the second semiconductor chip 231. Second metal bumps 232b have been formed on the second semiconductor chip 232. The second semiconductor chip 232 is placed on the second semiconductor chip 231 in a shifted manner such that the second metal bumps 232b are located at positions corresponding to the columnar electrodes 242. When mounting the second semiconductor chip 232 on the third resin layer 33, the front end of each columnar electrode 242 is bonded to the corresponding second metal bump 232b. The bonding may be performed, for example, by applying a flux to the second metal bumps 232b, and mounting the second semiconductor chip 232, followed by reflowing or by thermal compression bonding with an FC bonder. The reflowing may be performed in a reducing atmosphere. It is also possible to use a method involving temporary compression bonding with an FC bonder, followed by heating under pressure by laser reflow.

A third resin layer 33 is formed on the second semiconductor chip 232. The third resin layer 33 can be formed by the above-described method using the same material as that described above. The second semiconductor chip 233 is mounted on the third resin layer 33 formed on the second semiconductor chip 232. When mounting the second semiconductor chip 233, it is placed on the second semiconductor chip 232 in a shifted manner such that the second metal bumps 233b are located at positions corresponding to the columnar electrodes 243. When mounting the second semiconductor chip 233 on the third resin layer 33, the front end of each columnar electrode 243 is bonded to the corresponding second metal bump 233b. The bonding can be performed in the manner described above.

A third resin layer 33 is formed on the second semiconductor chip 233. The third resin layer 33 can be formed by the above-described method using the same material as that described above. The second semiconductor chip 234 is mounted on the third resin layer 33 formed on the second semiconductor chip 233. When mounting the second semiconductor chip 234, it is placed on the second semiconductor chip 233 in a shifted manner such that the second metal bumps 234b are located at positions corresponding to the columnar electrodes 244. When mounting the second semiconductor chip 234 on the third resin layer 33, the front end of each columnar electrode 244 is bonded to the corresponding second metal bump 234b. The bonding can be performed in the manner described above.

Subsequently, as shown in FIG. 34, a molded resin layer 25 is formed. The molded resin layer 25 is formed such that it covers the second semiconductor chips 231, 232, 233, 234 and the columnar electrodes 242, 243, 244. The same resins as those described above may be used as a molding resin that forms the molded resin layer 25, and therefore a description thereof is omitted.

Subsequently, as shown in FIG. 35, the glass support 51 is peeled off by laser peeling. Subsequently, the release layer 52 is removed. Subsequently, metal balls 26 are formed on the back surface of the interconnect substrate 21F, followed by dicing to complete the semiconductor device 2F (see FIG. 30).

As described hereinabove, the semiconductor device 2, 2A, 2E, 2F includes: the interconnect substrate 21, 21E, 21F internally having interconnect layers; the first semiconductor chip 22 provided on the interconnect substrate 21, 21E, 21F; the second semiconductor chips 231, 232, 233, 234 mounted on the first semiconductor chip 22 in a shifted manner and each having metal bumps on a surface facing the interconnect substrate 21, 21E, 21F; and the columnar electrodes 241, 242, 243, 244 provided on the interconnect substrate 21, 21E, 21F and each including a wire connected to the second metal bumps 231b, 232b, 233b, 234b provided on the second semiconductor chips 231, 232, 233, 234. It is possible to use the pillar bumps 231c, 232c, 233c, 234c and the low-melting metal portions 231d, 232d, 233d, 234d instead of the second metal bumps 231b, 232b, 233b, 234b. The first semiconductor chip 22 has been flip-chip mounted on the interconnect substrate 21, 21E, 21F.

As described hereinabove, the method for manufacturing the semiconductor device 2, 2A, 2E, 2F includes: preparing the interconnect substrate 21, 21E, 21F internally having interconnect layers; mounting the first semiconductor chip 22 on the interconnect substrate 21, 21E, 21F; forming the columnar electrodes 241, 242, 243, 244, each including a wire, on the interconnect substrate 21, 21E, 21F; and mounting the second semiconductor chips 231, 232, 233, 234 on the first semiconductor chip 22 in a shifted manner, and bonding the columnar electrodes 241, 242, 243, 244 to the second metal bumps 231b, 232b, 233b, 234b provided on the second semiconductor chips 231, 232, 233, 234. It is possible to use the pillar bumps 231c, 232c, 233c, 234c and the low-melting metal portions 231d, 232d, 233d, 234d instead of the second metal bumps 231b, 232b, 233b, 234b. The first semiconductor chip 22 is flip-chip mounted on the interconnect substrate 21, 21E, 21F.

As described above with reference to FIG. 19, the fourth resin layer 31 as a resin portion may be provided in an area of the interconnect substrate 21 where the columnar electrodes 241, 242, 243, 244 are in contact with the interconnect substrate 21. The method for manufacturing the semiconductor device 2 may include forming the columnar electrodes 241, 242, 243, 244 on the interconnect substrate 21, and forming the fourth resin layer 31 as a resin portion in an area of the interconnect substrate 21 where the columnar electrodes 241, 242, 243, 244 are in contact with the interconnect substrate 21.

As described above with reference to FIG. 20, the stepped portion 32 may be provided on the surface of the interconnect substrate 21. The columnar electrodes 242D, 243D, 244D are provided on the stepped portion 32. The method for manufacturing the semiconductor device 2 may include preparing the interconnect substrate 21 internally having interconnect layers and having the stepped portion 32 on its surface, and forming the columnar electrodes 242D, 243D, 244D on the stepped portion 32.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
an interconnect substrate including a first electrode and a plurality of interconnect layers;
a first semiconductor chip including a second electrode connected to the first electrode provided on a surface of the first semiconductor chip facing the interconnect substrate disposed over the interconnect substrate;
a plurality of second semiconductor chips disposed over the first semiconductor chip in a shifted manner and including a plurality of first metal bumps, each of the plurality of first metal bumps disposed on a surface of a corresponding one of the plurality of second semiconductor chips facing the interconnect substrate;
a plurality of columnar electrodes connecting the plurality of first metal bumps to a plurality of portions of the columnar electrodes, respectively;
a first resin provided between the surface of the interconnect substrate and the first semiconductor chip and physically contacting the first electrode and the second electrode; and
a second resin including a material different from a material of the first resin provided over the interconnect substrate and the plurality of second semiconductor chips,
wherein a first diameter of one of the plurality of first metal bumps and a second diameter of one of the plurality of portions of the columnar electrodes are larger than a third diameter of one of the plurality of columnar electrodes,
the first resin being physically spaced from the second semiconductor chips,
an area of the first semiconductor chip is smaller than an area of the second semiconductor chips when viewed from above.

2. The semiconductor device according to claim 1, wherein the interconnect substrate has a stepped portion, and wherein the plurality of columnar electrodes are provided on the stepped portion.

3. The semiconductor device according to claim 2, wherein the stepped portion forms in accordance with the shifted manner.

4. The semiconductor device according to claim 2, wherein the plurality of columnar electrodes have a same height.

5. The semiconductor device according to claim 1, wherein the plurality of columnar electrodes have different heights.

6. The semiconductor device according to claim 1, wherein a material of the plurality of portions of the columnar electrodes and a material of the plurality of columnar electrodes are the same.

* * * * *